United States Patent
Ito

(10) Patent No.: US 6,707,866 B1
(45) Date of Patent: Mar. 16, 2004

(54) CLOCK GENERATOR, CLOCK GENERATING METHOD, AND SIGNAL RECEIVER

(75) Inventor: Osamu Ito, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/509,846

(22) PCT Filed: Aug. 4, 1999

(86) PCT No.: PCT/JP99/04219

§ 371 (c)(1),
(2), (4) Date: Jun. 28, 2000

(87) PCT Pub. No.: WO00/08790

PCT Pub. Date: Feb. 17, 2000

(30) Foreign Application Priority Data

Aug. 4, 1998 (JP) ............................................. 10-220021

(51) Int. Cl.[7] ................................................. H04L 7/00
(52) U.S. Cl. ....................................... 375/354; 375/376
(58) Field of Search ................................ 375/371, 373, 375/375, 376, 354; 327/147, 149, 150, 156, 158, 159; 331/1 A

(56) References Cited

U.S. PATENT DOCUMENTS 5,883,533 A * 3/1999 Matsuda et al. ............ 327/156
5,892,552 A * 4/1999 Kim ........................... 348/478
5,977,836 A * 11/1999 Swan et al. ................. 331/1 A

FOREIGN PATENT DOCUMENTS

| JP | 7087056 | 3/1995 |
| JP | 8163076 | 6/1996 |
| JP | 8251136 | 9/1996 |

* cited by examiner

Primary Examiner—Don N. Vo
(74) Attorney, Agent, or Firm—Jay H. Maioli

(57) ABSTRACT

A selector 203 selects two frequency-dividing number data items. One of the data items represents at least one integral frequency-dividing number greater than a ratio (fa/fb) of the frequency (fa) of an input clock signal to the frequency (fb) of a target output clock signal. The other data item represents at least one integral frequency-dividing number smaller than the ratio (fa/fb). A frequency-division counter 204 divides the frequency of the input clock signal by the frequency-dividing number represented by the frequency-dividing number data items selected by the selector 203. A select data generator 205 generates selection data in accordance with the frequency data representing the target frequency (fb). The selection data causes the selector 203 to select the frequency-dividing number data items repeatedly, thereby to divide the frequency of the input clock signal, so that the average frequency of the output clock signal generated by the frequency-division counter 204 may equal the target frequency (fb).

15 Claims, 13 Drawing Sheets

CLOCK GENERATOR, CLOCK GENERATING METHOD, AND SIGNAL RECEIVER

TECHNICAL FIELD

The present invention relates to an interface for use in DVB (Digital Video Broadcast)-T, and more particularly to an apparatus for generating a clock signal, a method of generating a clock signal, and a signal-receiving method.

BACKGROUND ART

FIG. 1 is a block diagram showing a conventional receiving system 10 that utilizes orthogonal frequency division multiplex (OFDM).

This receiving system 10 comprises an OFDM receiver 2 connected to an antenna 1, an MPEG2 decoder 3 connected to the OFDM receiver 2, and a monitor apparatus 4 connected to the MPEG2 decoder 3.

In the receiving system 10, the OFDM receiver 2 receives the electric waves that the antenna 1 has caught.

The OFDM receiver 2 is composed of an OFDM receiving section 5, a rate converting section 6, and a clock generating section 7. The OFDM receiving section 5 receives a signal supplied from the antenna 1 and demodulates the signal. The clock generating section 7 generates a clock signal from the signal input from the OFDM receiving section 5. The rate converting section 6 converts the rate of the signal input from the OFDM receiving section 5 and outputs the rate to the MPEG2 decoder 3.

The MPEG2 decoder 3 decodes the input signal in accordance with the MPEG2 standards and outputs a reproduced image signal to the monitor apparatus 4. The monitor apparatus 4 displays the image represented by the input image signal.

The OFDM receiving section 5 and the rate converting section 6, both incorporated in the OFDM receiver 2, may be replaced in practice by a device that performs the functions of them. In this case, too, the clock generating section 7 needs to use the clock signal regenerated from the received signal and to generate a new clock signal suitable for the transmission mode.

This will be described in detail as follows.

In the TS interface for DVB (Digital Video Broadcast)-T, there are used TPS (Transmission Parameter Signaling) carriers as signaling parameters concerning the transmission processes such as channel coding and modulation. A guard interval length GIL, a modulation/demodulation mode, a coding ratio (bank chad number) and the like are given as the signaling parameters. The TS interface for DVB-T is based on the super-frame concept. The transmission mode can therefore be changed for each super frame in the TS interface. (In practice, the mode is seldom changed.) If the transmission mode is changed, the rate of TSI clock will change.

There are various kinds of transmission modes concerning the clock rate. They are a coding ratio, a modulation system and a guard interval. The number of clocks in one super frame and the number of MPEG2 packets (each consisting of 188 data items) for the super frame depend upon these three parameters. It is therefore necessary to generate a clock signal for each parameter within the super frame, in order to make an access, at a constant clock rate, to the MPEG2 encoder of the transmitting side. There are 60 possible combinations of these parameters. Their frequency-dividing ratios are complex. The clock signal on the transmitting side has the frequency of 9.143[MHz] (=64/7[MHz]), and the access request to the MPEG2 encoder has the frequency ranging from 0.677[MHz] to 4.295[MHz].

The OFDM receiving section 5 of the OFDM receiver 2 includes an OFDM demodulation block, a Viterbi decoding block, and an RS (Read-Solomon) decoding block. The OFDM demodulation block has parameters for the guard interval length and the modulation/demodulation mode. The Viterbi block has a parameter for the coding ratio (bank chad number). In the guard interval of the OFDM demodulation block, for example, there exists ineffective data that amounts to a quarter (¼) of the effective data. If a method in which the ineffective data is transmitted to the next block, together with the control signal identifying the ineffective data, is employed, the data rate valid at present will not change and the rate will not be converted, either. On the other hand, if a method in which a clock signal having a cycle that is 5/4 of the present data rate is used and only the effective data is transmitted to the next block, it will be necessary to convert the rate when the data is output from the OFDM demodulation block. In this case, the OFDM receiving section 5 and the rate converting section 6 must be replaced by a device that performs their functions.

No matter whether the data rate is converted for each block or for all blocks at a time, there is required a clock signal that has a rate different from that of the clock signal regenerated in the OFDM demodulation block. For example, the above-mentioned clock signal having a 5/4 cycle needs to be used. The guard interval length may be ¼ or ⅛. It follows that a clock signal having a 5/4 cycle or a clock signal having a 9/8 cycle is required. That is, a desired clock signal must be generated for each transmission mode (parameter).

PLL (Phase Locked Loop) technique has hitherto been used to generate and regenerate clock signals. FIG. 2 is a block diagram illustrating the basic structure of the clock generating section 7 that utilizes the conventional PLL technique. The signal output from a reference signal oscillator 11 (i.e., a signal corresponding to the signal that the OFDM receiving section 5 has generated from the signal it had received) is input to a phase comparator 12. The phase comparator 12 generates a phase-difference signal from the input signal and the output of a voltage-controlled oscillator 14. The phase-difference signal is output to an LPF (Low-Pass Filter) 13. The LPF 13 removes the unnecessary high-frequency component from the input signal, generating a signal. The output signal of the LPF 13 is supplied to the voltage-controlled oscillator 14. The voltage-controlled oscillator 14 generates a clock signal that has a frequency corresponding to the level of the input signal. The clock signal is output from a clock output terminal 15 and supplied to the phase comparator 12. The characteristics of the LPF 13 greatly influence the operating characteristics of the PLL. In view of this, the characteristic design of the LPF 12 is of vital importance.

FIG. 3 is a block diagram depicting another structure the clock generating section 7 may have. The clock generating section 7 shown in FIG. 3 has a first frequency divider 21 and a second frequency divider 22 in addition to the components of the basic structure illustrated in FIG. 2. The first frequency divider 21 frequency-divides the signal output from the reference signal oscillator 11, generating a signal. The signal is supplied to the phase comparator 12. The second frequency divider 22 frequency-divides the signal output from the voltage-controlled oscillator 14, thus generating a signal. This signal is supplied to the phase comparator 12.

The first frequency divider 21 divides the frequency of the signal output from the reference signal oscillator 11 by m. The second frequency divider 22 divides the frequency of the signal output from the reference signal oscillator 11 by n. The phase comparator 12 compares the signals input from the first frequency divider 21 and second frequency divider 22, in terms of phase, and generates a phase-difference signal. The LPF 13 removes the unnecessary high-frequency component from the phase-difference signal and outputs the phase-difference signal to the voltage-controlled oscillator 14. The voltage-controlled oscillator 14 generates a clock signal that has the frequency corresponding to the input signal. The clock signal is output from the clock output terminal 15.

The characteristics of the LPF 13 greatly influence the operating characteristics of the clock generating section, such as that required to obtain a desired output clock signal, the operating stability after the generation of the clock signal, the restriction imposed by the frequency division, and the follow-up to the output changes. In order to impart desired operating characteristics to the clock generating section, the LPF 13 must be designed to operate with high precision. This, however, requires much labor and much time, inevitably increasing the manufacturing cost of the LPF 13.

DISCLOSURE OF INVENTION

Accordingly, the object of this invention is to provide an apparatus for generating a clock signal, a method of generating a clock signal, and a signal-receiving apparatus, in which a master clock is frequency-divided to generate a TSI clock signal by means of a simple circuit that has no feedback loop such as a PLL.

A clock signal generating apparatus according to this invention comprises: selection means for selecting one of two frequency-dividing number data items in accordance with selection data, one of the data items representing at least one integral frequency-dividing number greater than a ratio (fa/fb) of the frequency (fa) of an input clock signal to the frequency (fb) of a target output clock signal, and the other of the data items representing at least one integral frequency-dividing number smaller than the ratio (fa/fb); frequency-dividing means for dividing the frequency of the input clock signal by the frequency-dividing number represented by the data item selected by the selection means, thereby to generate an output clock signal; and selection data generating means for generating the selection data in accordance with frequency data representing the target frequency (fb), said selection data causing the selection means to select the frequency-dividing number data item repeatedly in response to clock pulses of the input clock signal, thereby to divide the frequency of the input clock signal and to make the average frequency of the clock signal output from the frequency-dividing means equal to the frequency (fb).

A method of generating a clock signal, according to the present invention, comprises the steps of: generating a frequency-dividing number data item representing at least one integral frequency-dividing number greater than a ratio (fa/fb) of the frequency (fa) of an input clock signal to the frequency (fb) of a target clock signal, and a frequency-dividing number data item representing at least one integral frequency-dividing number smaller than the ratio (fa/fb); dividing the frequency of the input clock signal by repeatedly using at least two frequency-dividing numbers represented by the frequency-dividing number data items, in accordance with selection data; and generating an output clock signal having a frequency equal to the target frequency (fb).

A signal-receiving apparatus according the invention comprises: demodulation means for demodulating an orthogonal frequency-division multiplex signal received; clock signal generating means for two frequency-dividing number data items in accordance with transmission parameter data contained in the demodulated signal output from the demodulation means and repeatedly using the at least two frequency-dividing numbers represented by the frequency-dividing number data items, in accordance with selection data, thereby dividing the frequency of an input clock signal and generating an output clock signal having an average frequency equal to a target frequency (fb) that accords with transmission mode, one of the data items representing at least one integral frequency-dividing number greater than a ratio (fa/fb) of the frequency (fa) of the input clock signal to the frequency (fb) of the target output clock signal, and the other of the data items representing at least one integral frequency-dividing number smaller than the ratio (fa/fb); and rate converting means for converting the clock rate of the demodulated signal output from the clock signal generating means, to a data rate that accords with the transmission mode, by using the output clock signal generated by the clock signal generating means.

BEST MODE FOR CARRYING OUT THE INVENTION

An embodiment of the present invention will be described, with reference to the accompanying drawings.

Figure 1:
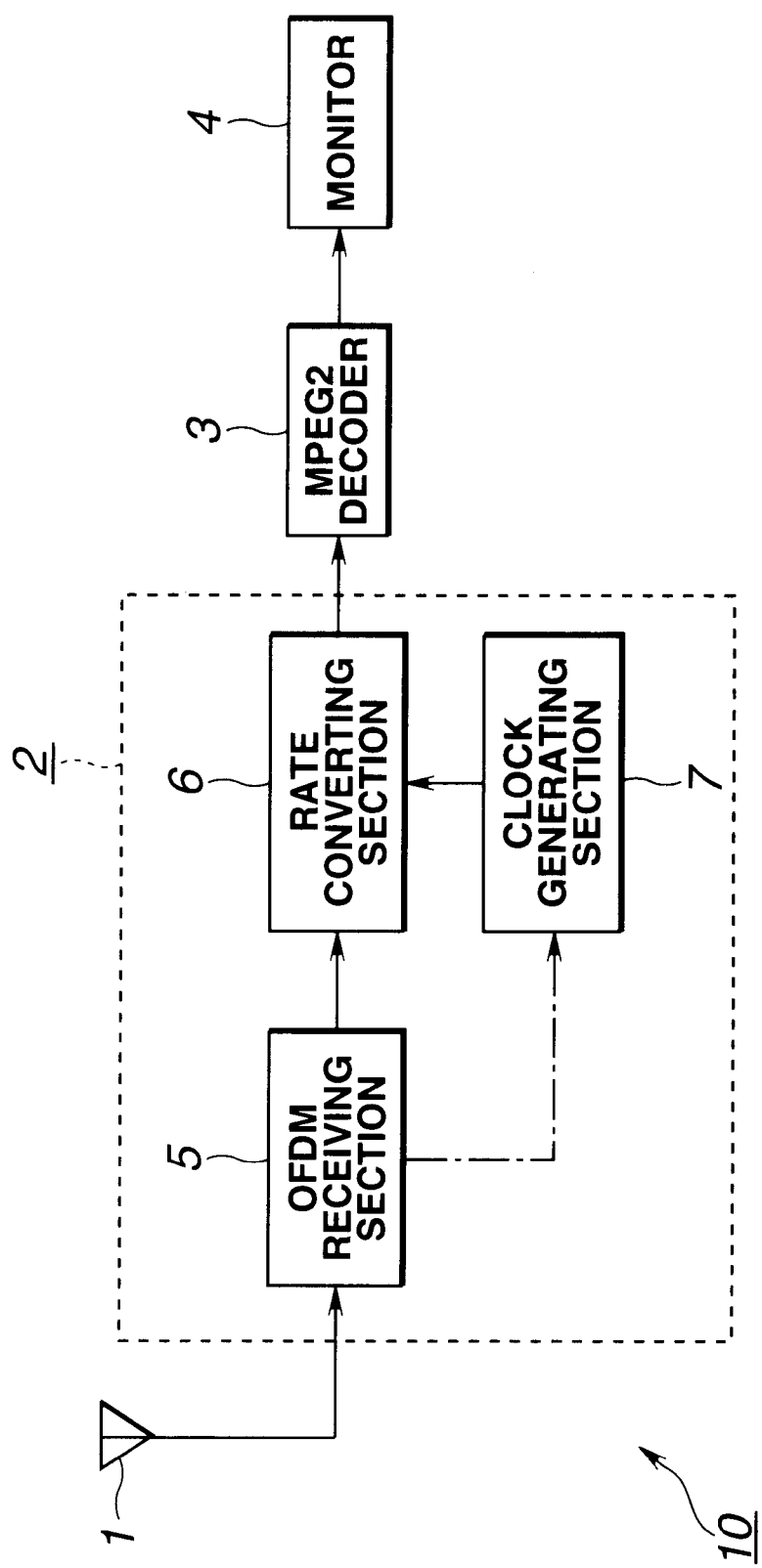
FIG. 1 is a block diagram showing the structure of a conventional OFDM receiving system.
Figure 2:
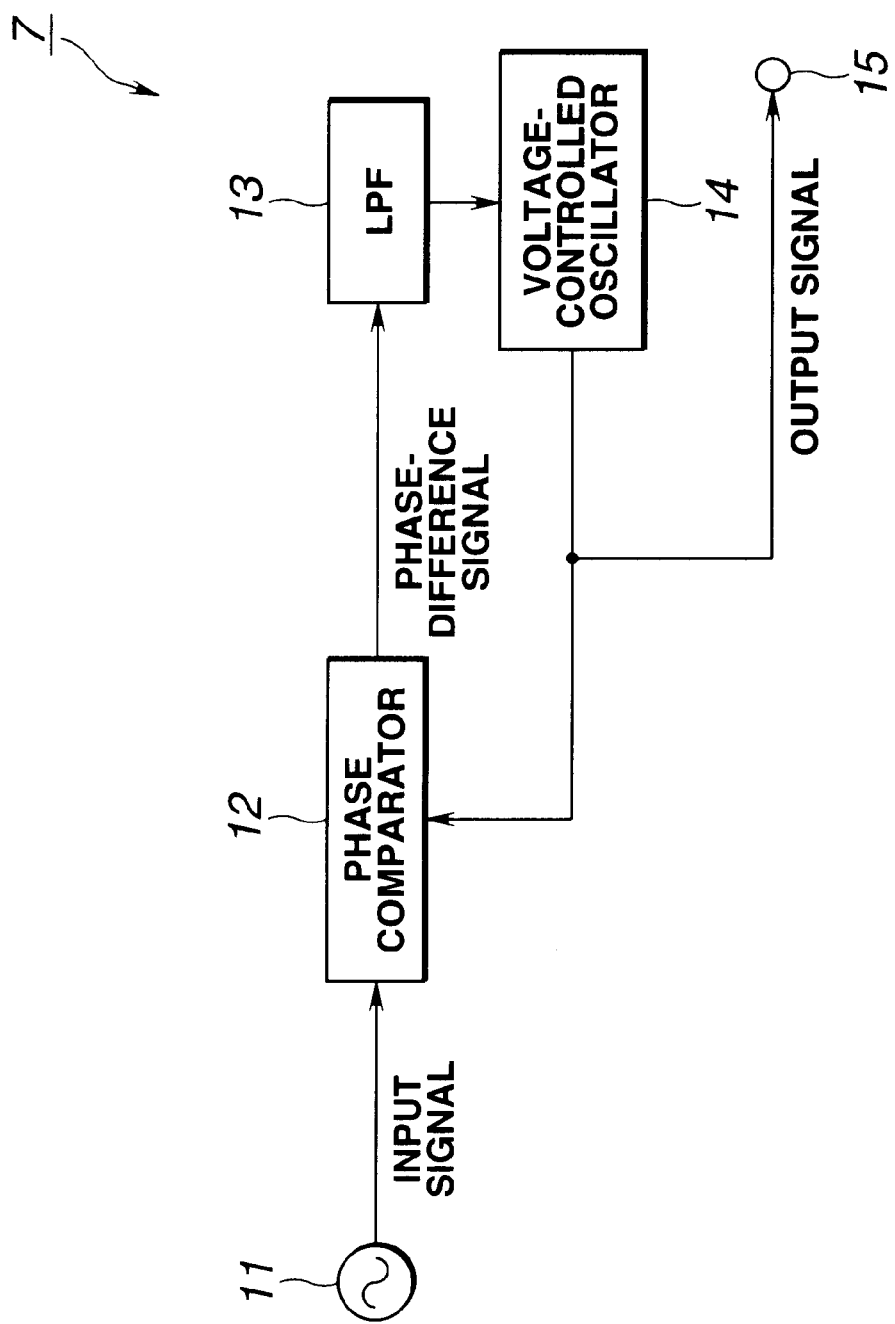
FIG. 2 is a block diagram illustrating the structure of the clock generating section incorporated in the conventional OFDM receiving system.
Figure 3:
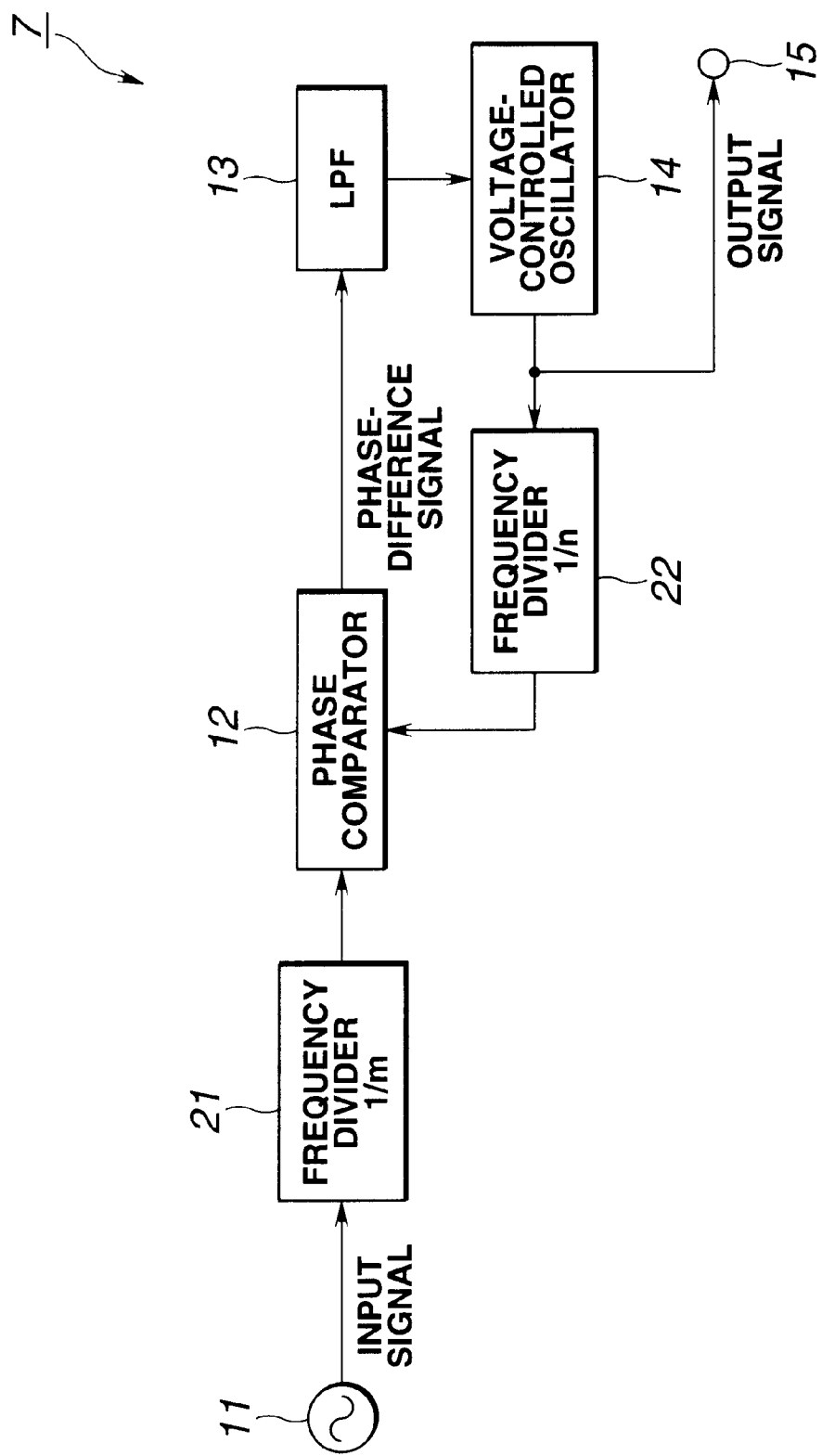
FIG. 3 is a block diagram depicting another conventional OFDM receiving system.
Figure 4:
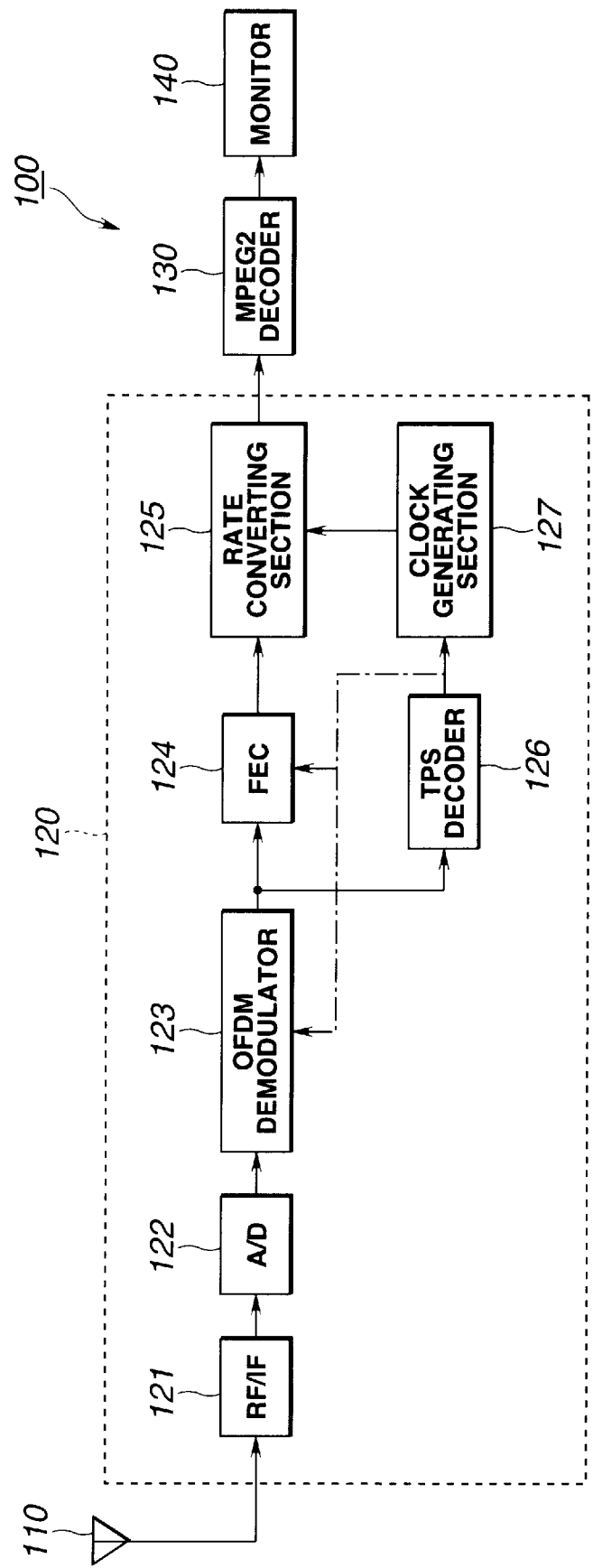
FIG. 4 is a block diagram illustrating the structure of an OFDM receiving system to which present invention is applied.

This invention is applied to, for example, such an OFDM (Orthogonal Frequency Division Multiplex Receiving) system 100 as is shown in FIG. 4.

The OFDM receiving system 100 comprises an OFDM receiver 120, an MPEG2 decoder 130, and a monitor apparatus 140. The OFDM receiver 120 is connected to an antenna 110. The MPEG2 decoder 130 is connected to the OFDM receiver 120. The monitor apparatus 140 is connected to the MPEG2 decoder 120.

In the receiving system 100, the OFDM receiver 120 receives the electric waves that the antenna 110 has caught.

The OFDM receiver 120 comprises an RF/IF amplifier 121, an A/D converter 122, an OFDM demodulator 123, an FEC (Forward Error Correction) circuit 124, a rate converting section 125, a TPS (Transmission Parameter Signaling) decoder 126, and a clock generating section 127. The RF/IF amplifier 121 is connected to the antenna 110. The A/D converter 122 receives the output of the RF/IF amplifier 121. The OFDM demodulator 123 receives the output of the A/D converter 122. The FEC circuit 124 receives the output of the OFDM demodulator 123. The rate converting section 125 receives the output of the FEC circuit 124. The TPS decoder 126 receives the output of the OFDM demodulator 123. The clock generating section 127 receives the output of the TPS decoder 126.

In the OFDM receiver 120, the RF/IF amplifier 121 receives a signal (OFDM signal) from the antenna 110, converts the signal to an intermediate-frequency signal and amplifies the intermediate-frequency signal. The signal amplified is supplied to the A/D converter 122. The A/D converter 122 receives the intermediate-frequency signal from the RF/IF amplifier 121 and converts the same to a digital intermediate-frequency signal. The digital intermediate-frequency is supplied to the OFDM demodulator 123. The OFDM demodulator 123 processes the digital intermediate-frequency signal supplied from the A/D converter 122, thereby demodulating the same and generating an OFDM signal. The demodulated output signal is supplied from the OFDM demodulator 123 to the FEC circuit 124 and TPS decoder 126.

The TPS decoder 126 decodes the TPS signal contained in the demodulated output of the OFDM demodulator 123, thus extracting a signaling parameter. The signaling parameter is supplied to OFDM demodulator 123, FEC circuit 124 and clock generating section 127. The clock generating section 127 generates a clock signal having a frequency to be applied to the OFDM signal, in accordance with the signaling parameter supplied from the TPS decoder 126. The clock signal is supplied to the rate converting section 125.

The FEC circuit 124 performs error correction on the demodulated output signal supplied from the OFDM demodulator 123. The demodulated output signal, thus corrected, is supplied to the rate converting section 125. The rate converting section 125 converts the data rate of the demodulated output signal supplied via the FEC circuit 124 to a data rate that accords with the transmission mode.

The OFDM receiver 120 supplies the demodulated output signal, whose data rate has been converted by the rate converting section 125, to MPEG2 decoder 130.

The MPEG2 decoder 130 decodes the demodulated output signal supplied from the OFDM receiver 120, in accordance with the MPEG2 standards, thereby reproducing an image signal. The image signal is output to the monitor apparatus 140. The monitor apparatus 140 displays the image represented by the input image signal.

In a TS interface for use in DVB (Digital Video Broadcast)-T, TPS carriers are as signaling parameters concerning the transmission processes such as channel coding and modulation. OFDM symbols contains a TPS bit each. Each TPS block (corresponding to one OFDM frame) consists of 68 bits ($S_0$–$S_{67}$), which are defined as shown in the following Table 1.

TABLE 1

| | TPS signal data |
|---|---|
| Bit number | Purpose/Content |
| $S_0$ | Initialization |
| $S_1$–$S_{16}$ | Synchronization word |
| $S_{17}$–$S_{22}$ | Length indicator |
| $S_{23}$, $S_{24}$ | Frame number |
| $S_{25}$, $S_{26}$ | Constellation |
| $S_{27}$, $S_{28}$, $S_{29}$ | Hierarchy information |
| $S_{30}$, $S_{31}$, $S_{32}$ | Code rate, HP stream |
| $S_{33}$, $S_{34}$, $S_{35}$ | Code rate, LP stream |
| $S_{36}$, $S_{37}$ | Guard interval |
| $S_{38}$, $S_{39}$ | Transmission mode |
| $S_{40}$–$S_{53}$ | Reserved for future use |
| $S_{54}$–$S_{67}$ | Error protection |

The bit $S_0$ of the TPS is an initializing bit for differential 2PSK modulation. Bits $S_1$–$S_{16}$ of the TPS are a synchronization word that indicates the start position of the TPS. Bits $S_{17}$–$S_{22}$ of the TPS are the information that represents the length of the TPS in terms of number of bits. Bits $S_{23}$ and $S_{24}$ of the TPS are the information that represents the numbers assigned to the four frames constituting the super frame. Bits $S_{25}$ and $S_{26}$ of the TPS are the information that specifies the type of the modulation employed (QPSK, 16QAM or 64QAM). Bits $S_{27}$, $S_{28}$ and $S_{29}$ of the TPS are the hierarchy information data indicating the value of QAM constellation. Bits $S_{30}$, $S_{31}$ and $S_{32}$ of the TPS are the information that represents the coding ratio (½, ⅔, ¾, ⅚ or ⅞) for HP streams. Bits $S_{33}$, $S_{34}$ and $S_{35}$ of the TPS are the information that represents the coding ratio (½, ⅔, ¾, ⅚ or ⅞) for LP streams. Bits $S_{36}$ and $S_{37}$ of the TPS are the information that represents the guard interval value (1/32, 1/16, ⅛ or ¼). Bits $S_{38}$ and $S_{39}$ of the TPS are the information that specifies the transmission mode (2 k mode or 8 k mode). Bits $S_{54}$–$S_{64}$ of the TPS are the information for use in error detection.

In the TS interface for use in DVB (Digital Video Broadcast)-T, the number [Z] of clock pulses in one super frame is given by using the number of frames, the number of OFDM symbols, and the sum of the carriers and guard interval length GIL, as seen from the following equation (1).

$$Z = 4 \times 68 \times (2048 + GIL) \quad (1)$$

The following Table 2 shows the number [Z] of clock pulses in one super frame, which has been obtained by the equation (1).

TABLE 2

| | Number of clock pulses in one super frame | | | |
|---|---|---|---|---|
| GIL | 512 | 256 | 128 | 64 |
| Z | 696320 | 626688 | 591872 | 574464 |

The number [Y] of data items required in one super frame (i.e., the number of bits) is given by using the number of frames, the number of OFDM symbols, the number of effective carriers, and the value [QAM] set for the modulation type, as seen from the following equation (2).

$$Y = 4 \times 68 \times 1512 \times QAM \quad (2)$$

The following Table 3 shows the number [Y] of data items (number of bits) required in one super frame, which has been obtained by the equation (2).

TABLE 3

| | Number [Y] of data items (number of bits) required in one super frame | | |
|---|---|---|---|
| QAM | 2(QPSK) | 4(16QAM) | 6(64QAM) |
| Y | 822528 | 1645056 | 2467584 |

The number [X] of bits in an RS packet output is:

$$X = 204 \times 8 \quad (3)$$

Therefore, the number [W] of MPEG2 packets for RS, required in one super frame, is given by using the values specified above and the coding ratio, as is defined by the following equation.

$$W = (Y \text{ rate})/X \quad (4)$$
$$= 252 \times QAM \times \text{rate}$$

The following table 4 shows the number [W] of MPEG2 packets for RS, required in one super frame, which has been obtained by the equation (4).

TABLE 4

| | Number [W] RS MPEG2 packets required in one super frame | | |
|---|---|---|---|
| rate/QAM | 2 (QPSK) | 4 (16QAM) | 6 (64QAM) |
| 1/2 | 252 | 504 | 756 |
| 2/3 | 336 | 672 | 1008 |
| 3/4 | 378 | 756 | 1134 |
| 5/6 | 420 | 840 | 1260 |
| 7/8 | 441 | 882 | 1323 |

The number [V] of clock pulses required to request for the number W of packets depends on the specification of the MPEG2 decoder on the transmitting side. It is estimated that 188 clock pulses or 204 clock pulses are required for one packet. Here, the mode is used in which 204 clock pulses are used to request for one packet. In this case, the number [V] of clock pulses is given by the following equation (5).

$$V = W \times 204 \quad (5)$$
$$= 51408 \times QAM \times \text{rate}$$

The following table 5 shows the number [V] of clock pulses required to request for the number [W] of packets, which has been obtained by the equation (5).

TABLE 5

| | Number [V] of clock pulses required to request for the number [W] of packets | | |
|---|---|---|---|
| rate/QAM | 2 (QPSK) | 4 (16QAM) | 6 (64QAM) |
| 1/2 | 51408 | 102816 | 154224 |
| 2/3 | 68544 | 137088 | 205632 |
| 3/4 | 77112 | 154224 | 231336 |
| 5/6 | 85680 | 171360 | 257040 |
| 7/8 | 89964 | 179928 | 269892 |

The request clock rate U [MHz] applied at this time is 9.143 [MHz] (=64/7 [MHz]) on the transmitting side. Hence:

$$U = (64/7) \times V/Z \quad (6)$$
$$= (64/7aa) \times 51408 \times QAM \times \text{rate}/(4 \times 68 \times (2048 + GIL))$$
$$= 1728 \times QAM \times \text{rate}/(2048 + GIL)$$

Tables 6A to 6D presented below show various request clock rates U [MHz] which have been obtained by the equation (6).

TABLE 6A

| | Request clock rate U [MHz] | | |
|---|---|---|---|
| GIL | | 512 | |
| rate\QAM | 2 | 4 | 6 |
| 1/2 | 0.675 | 1.350 | 2.025 |
| 2/3 | 0.900 | 1.800 | 2.700 |
| 3/4 | 1.013 | 2.025 | 3.038 |
| 5/6 | 1.250 | 2.250 | 3.375 |
| 7/8 | 1.181 | 2.363 | 3.544 |

TABLE 6B

| | Request clock rate U [MHz] | | |
|---|---|---|---|
| GIL | | 256 | |
| rate\QAM | 2 | 4 | 6 |
| 1/2 | 0.750 | 1.500 | 2.250 |
| 2/3 | 1.000 | 2.000 | 3.000 |
| 3/4 | 1.125 | 2.250 | 3.375 |
| 5/6 | 1.250 | 2.500 | 3.750 |
| 7/8 | 1.313 | 2.625 | 3.938 |

TABLE 6C

| | Request clock rate U [MHz] | | |
|---|---|---|---|
| GIL | | 128 | |
| rate\QAM | 2 | 4 | 6 |
| 1/2 | 0.794 | 1.588 | 2.382 |
| 2/3 | 1.059 | 2.118 | 3.176 |
| 3/4 | 1.191 | 2.382 | 3.574 |
| 5/6 | 1.324 | 2.647 | 3.971 |
| 7/8 | 1.390 | 2.779 | 4.169 |

TABLE 6D

| | Request clock rate U [MHz] | | |
|---|---|---|---|
| GIL | | 64 | |
| rate\QAM | 2 | 4 | 6 |
| 1/2 | 0.818 | 1.636 | 2.455 |
| 2/3 | 1.091 | 2.182 | 3.273 |
| 3/4 | 1.227 | 2.455 | 3.682 |
| 5/6 | 1.364 | 2.727 | 4.091 |
| 7/8 | 1.432 | 2.864 | 4.295 |

Assume that the master clock frequency $f_0$ is n times the transmission clock frequency of 9.143 [MHz] (=64/7 [MHz]). Namely, $$f_0: 64/7 \text{ [MHz]} = n:1 \tag{7}$$

Thus, the number [T] of master clock pulses generated in one super frame is obtained by the following equation (8). Hereafter, the frequency of master clock pulses shall be calculated by multiplying the transmission clock frequency by 6. The oscillation frequency is 54.857 [MHz].

$$\begin{aligned} T &= Z \times n \tag{8} \\ &= 4 \times 68 \times (2048 + GIL) \times n \\ &= 272 \times (2048 + GIL) \times n \\ &= 272 \times (2048 + GIL) \times 6 \\ &= 1632 \times (2048 + GIL) \end{aligned}$$

Table 7 shows the number [T] of master clock pulses generated in one super frame, which has been obtained by the equation (8) described above.

TABLE 7

| Number [T] of master clock pulses generated in one super frame | | | | |
|---|---|---|---|---|
| GIL | 512 | 256 | 128 | 64 |
| T | 4177920 | 3760128 | 3551232 | 3446784 |

Hence, the average frequency-dividing number [S] is calculated by the following equation (9):

$$\begin{aligned} S &= T/V \tag{9} \\ &= (1632 \times (2048 + GIL))/(51408 \times QAM \times \text{rate}) \\ &= (2/63) \times (2048 + GIL)/(QAM \times \text{rate}) \end{aligned}$$

Tables 8A to 8D presented below show various average frequency-dividing numbers [S] obtained by the equation (9).

TABLE 8A

| | Average frequency-dividing number [S] | | |
|---|---|---|---|
| GIL | | 512 | |
| rate\QAM | 2 | 4 | 6 |
| 1/2 | 5120/63 | 2560/63 | 5120/189 |
| 2/3 | 1280/21 | 640/21 | 1280/63 |

TABLE 8A-continued

| | Average frequency-dividing number [S] | | |
|---|---|---|---|
| GIL | | 512 | |
| rate\QAM | 2 | 4 | 6 |
| 3/4 | 10240/189 | 5120/189 | 10240/567 |
| 5/6 | 1024/21 | 512/21 | 1024/63 |
| 7/8 | 20480/441 | 10240/441 | 20480/1323 |

TABLE 8B

| | Average frequency-dividing number [S] | | |
|---|---|---|---|
| GIL | | 256 | |
| rate\QAM | 2 | 4 | 6 |
| 1/2 | 512/7 | 256/7 | 512/21 |
| 2/3 | 384/7 | 192/7 | 128/7 |
| 3/4 | 1024/21 | 512/21 | 1024/63 |
| 5/6 | 1536/35 | 768/35 | 512/35 |
| 7/8 | 2048/49 | 1024/49 | 2048/147 |

TABLE 8C

| | Average frequency-dividing number [S] | | |
|---|---|---|---|
| GIL | | 128 | |
| rate\QAM | 2 | 4 | 6 |
| 1/2 | 4352/63 | 2176/63 | 4352/189 |
| 2/3 | 1088/21 | 544/21 | 1088/63 |
| 3/4 | 8704/189 | 4352/189 | 8704/567 |
| 5/6 | 4352/105 | 2176/105 | 4352/315 |
| 7/8 | 17408/441 | 8704/441 | 17408/1323 |

TABLE 8D

| | Average frequency-dividing number [S] | | |
|---|---|---|---|
| GIL | | 128 | |
| rate\QAM | 2 | 4 | 6 |
| 1/2 | 1408/21 | 704/21 | 1408/63 |
| 2/3 | 352/7 | 176/7 | 352/21 |
| 3/4 | 2816/63 | 1408/63 | 2816/189 |
| 5/6 | 1408/35 | 704/35 | 1408/105 |
| 7/8 | 5632/147 | 2816/147 | 5632/441 |

Thus, two appropriate frequency-dividing numbers can be obtained. For instance, when GIL=512, QAM=2(QPSK), and rate=½, the average frequency-dividing number [S] is obtained by the following equation (10):

$$\begin{aligned} S &= (2/63) \times (2048 + 512)/(2 \times (1/2)) \tag{10} \\ &= 5120/63 \\ &= 81.2 \end{aligned}$$

The average frequency-dividing number S is rounded off at the even-number unit, thereby obtaining a frequency-dividing number [80] and a frequency-dividing number [82]. The frequency is divided in units of odd numbers in order to impart a duty ratio of 50% to the clock signal generated. If it is unnecessary to do so, the frequency-dividing number

[81] or the frequency-dividing number [82] can be used. The average frequency-dividing number [S] is used for the purpose of generating a clock signal having sufficient accuracy (i.e., a clock signal that works as is desired).

The ratio at which the frequency-dividing numbers [80] and [82] are used can be obtained as will be described below.

Let us multiply, for example, the average frequency-dividing number [S] by 63 (i.e., the value of the denominator). The product corresponds to 63 output clock signals. This is equivalent to 5120 master clock signals. If 63 clock signals are counted in terms of the frequency-dividing number [80], there will be obtained 5040 clock signals (=80×63). The difference of 80 clock signals (=5120−5040) corresponds to 63 clock signals in terms of the frequency-dividing number [82]. (The 63 clock signals correspond to 23 times the frequency-dividing number [80] or 40 times the frequency-dividing number [82].) Thus, the difference is equivalent to 5120 master clocks. Since both the frequency-dividing number and the denominator are odd numbers, their values can be applied without being modified. Even if the denominator is an odd number, the number of output clock signals may be increased twice as much, whereby similar calculation becomes possible. The average frequency-dividing number may be an even integral number, depending upon the relation between the master clock signal used and the transmission mode selected. Such a case need not be discussed here and will not therefore be described hereinafter. Due to the master clock signal used, the cycle may not close in one super frame. Such master clock signals are used in the present system. Any clock signal having a frequency that is an integer multiple of the transmission clock frequency of 9.143 [MHz] can be an appropriate master clock signal.

The two appropriate frequency-dividing numbers, thus obtained, and their rates (the number of times they are used) are shown in Tables 9A to 9D. More precisely, frequency [A]:frequency-dividing number [B] (the ratio of the number of times the frequency-dividing number [A] is used to the number of times the frequency-dividing number [B] is used) is shown In Tables 9A to 9D.

TABLE 9A

Two appropriate frequency-dividing numbers and their rates (number of times they are used)

| GIL | 512 | | |
|---|---|---|---|
| rate\QAM | 2 | 4 | 6 |
| 1/2 | 80:82 | 40:42 | 26:28 |
| | (23:40) | (43:20) | (86:103) |
| 2/3 | 60:62 | 30:32 | 20:22 |
| | (11:10) | (16:5) | (53:10) |
| 3/4 | 54:56 | 26:28 | 18:20 |
| | (172:17) | (86:103) | (550:17) |
| 5/6 | 48:50 | 24:26 | 16:18 |
| | (13:8) | (17:4) | (55:8) |
| 7/8 | 46:48 | 22:24 | 14:16 |
| | (344:97) | (172:269) | (344:979) |

TABLE 9B

Two appropriate frequency-dividing numbers and their rates (number of times they are used)

| GIL | 256 | | |
|---|---|---|---|
| rate\QAM | 2 | 4 | 6 |
| 1/2 | 72:74 | 36:38 | 24:26 |
| | (3:4) | (5:2) | (17:4) |
| 2/3 | 54:56 | 26:28 | 18:20 |
| | (4:3) | (2:5) | (6:1) |
| 3/4 | 48:50 | 24:26 | 16:18 |
| | (13:8) | (17:4) | (55:8) |
| 5/6 | 42:44 | 20:22 | 14:16 |
| | (2:33) | (1:34) | (24:11) |
| 7/8 | 40:42 | 20:22 | 12:14 |
| | (5:44) | (27:22) | (5:142) |

TABLE 9C

Two appropriate frequency-dividing numbers and their rates (number of times they are used)

| GIL | 128 | | |
|---|---|---|---|
| rate\QAM | 2 | 4 | 6 |
| 1/2 | 68.70 | 34.36: | 22:24 |
| | (29:34) | (46:17) | (92:97) |
| 2/3 | 50:52 | 24:26 | 16:18 |
| | (2:19) | (1:20) | (23:40) |
| 3/4 | 46:48 | 22:24 | 14:16 |
| | (184:5) | (92:97) | (184:383) |
| 5/6 | 40:42 | 20:22 | 12:14 |
| | (29:76) | (67:38) | (29:286) |
| 7/8 | 38:40 | 18:20 | 12:14 |
| | (116:325) | (58:383) | (557:766) |

TABLE 9D

Two appropriate frequency-dividing numbers and their rates (number of times they are used)

| GIL | 64 | | |
|---|---|---|---|
| rate\QAM | 2 | 4 | 6 |
| 1/2 | 66:68(10:11) | 32:34(5:16) | 22:24(52:11) |
| 2/3 | 50:52(6:1) | 24:26(3:4) | 16:18(13:8) |
| 3/4 | 44:46(41:22) | 22:24(52:11) | 14:16(104:85) |
| 5/6 | 40:42(31:4) | 20:22(33:2) | 12:14(31:74) |
| 7/8 | 38:40 | 18:20(62:85) | 12:14 |
| | (124:23) | | (271:170) |

A clock signal generated by using the two appropriate frequency-dividing numbers and their rates (number of times they are used) thus obtained has such jitter as will be explained below.

The leading edges of the clock pulses generated by using an even frequency-dividing number have a time lag with respect to those of the clock pulses that have been at regular intervals by using the average frequency-dividing number S. This time lag shall be called leading-edge error. The leading-edge error changes with time. This change is known as jitter. That is, the leading-edge error is a time lag between the leading edge of each clock pulse generated by the clock signal generating apparatus of this invention and the leading edge of an ideal clock pulse.

Figure 5:
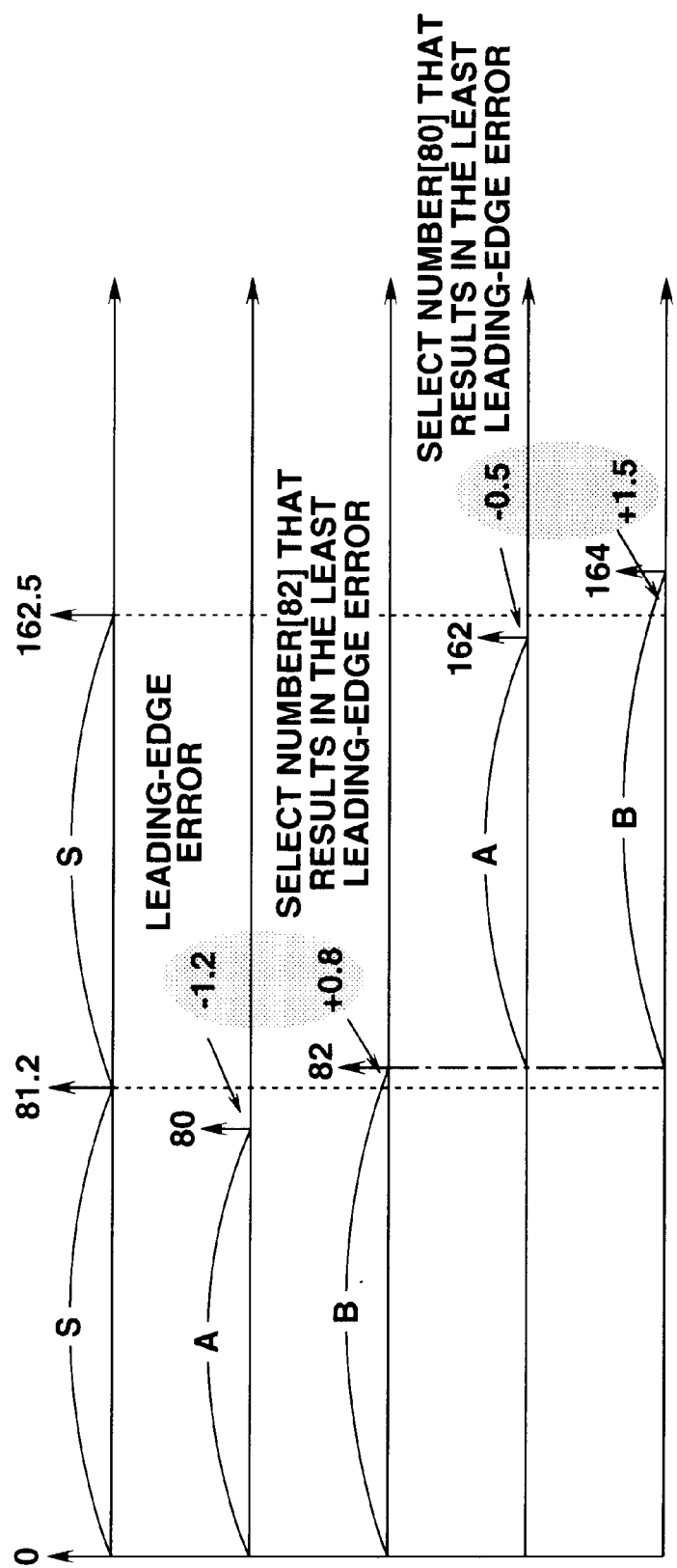
FIG. 5 is a diagram for explaining the method of selecting a frequency-dividing number in a clock signal generating apparatus according to the present invention.

The leading edge defined by the above-mentioned parameters is calculated as follows. It should be noted that the average frequency-dividing number S is 81.2 and that the two frequency-dividing numbers used are 80 and 82. Assume that the pulses of both clock signals synchronously rise at present, as is illustrated in FIG. 5. Namely, there is no leading-edge error. The ideal time when the next pulse should rise is 81.2 [clock]. (The unit used here is 1 [clock], which is one master clock pulse.) If the frequency-dividing number is 80, the time when the next pulse rises will be 80[clock] and the leading-edge error will be −1.2 [clock] (=80.0−81.2). If the frequency-dividing number is 82, the time when the next pulse rises will be 82[clock] and the leading-edge error will be +0.8 [clock] (=82.0−81.2).

It is desired that the next clock pulse rises at the time of 162.5 [clock] (=81.2×2). If the first frequency-dividing number is 82, the pulse will rise at the time of 162 [clock] (frequency-dividing number: 80) or at the time of 164 [clock] (frequency-dividing number: 82). The leading-edge error will be −0.5 [clock] (=162.0−162.5) or +1.5 [clock] (=164.0−162.5). Leading-edge errors can be sequentially obtained in this way.

Assume that the first frequency-dividing number is 80. Then, the pulse rises at the time of 160 [clock] (frequency-dividing number: 80) or at the time of 162 [clock] (frequency-dividing number: 82). In this case, the leading-edge error is −2.5 [clock] (=160.0−162.5) or −0.5 [clock] (=162.0−162.5).

The frequency-dividing number which results in a smaller leading-edge error than at any other leading edge of the clock signal is selected. Therefore, the maximum leading-edge error can be minimized.

In the instance described above, the first frequency-dividing number used is [82] and the second frequency-dividing number used is [80]. The maximum leading-edge error that may occur in this method is ±1 [clock]. More correctly, the maximum leading-edge error falls within half the difference between the two frequency-dividing numbers applied.

The master clock signal used here has a frequency of 54.857 [MHz], which is six times as high as the transmission clock frequency. Hence, the width of jitter is ±18.2 [ns]. This jitter width is much smaller than the allowance of 500 [ns] applied to the MPEG2/TS interface.

Assume that the frequency-dividing number [80] is first used 23 times and the frequency-dividing number [82] is then used 40 times, as one group of frequency-dividing numbers, in order to generate an output clock signal. In this case, the leading-edge error is −1.2 [clock] for each output clock pulse. At the time the frequency-dividing number [80] has been applied 23 times, the leading-edge error amounts to −2 9.2 [clock] (−1.2×23). Then, the frequency-dividing number [82] is applied repeatedly. When the frequency-dividing number [82] is used for the fortieth time, the leading-edge error decreases to 0 [clock]. (Small calculation error results, due to the rounding-off operation, but the leading-edge error can be represented by an integral number.) Thus, the maximum leading-edge error is about 30 times as that of the master clock signal. That is, the jitter has amounted to 30 [clock]. This is not desirable for the circuit operation.

Figure 6:
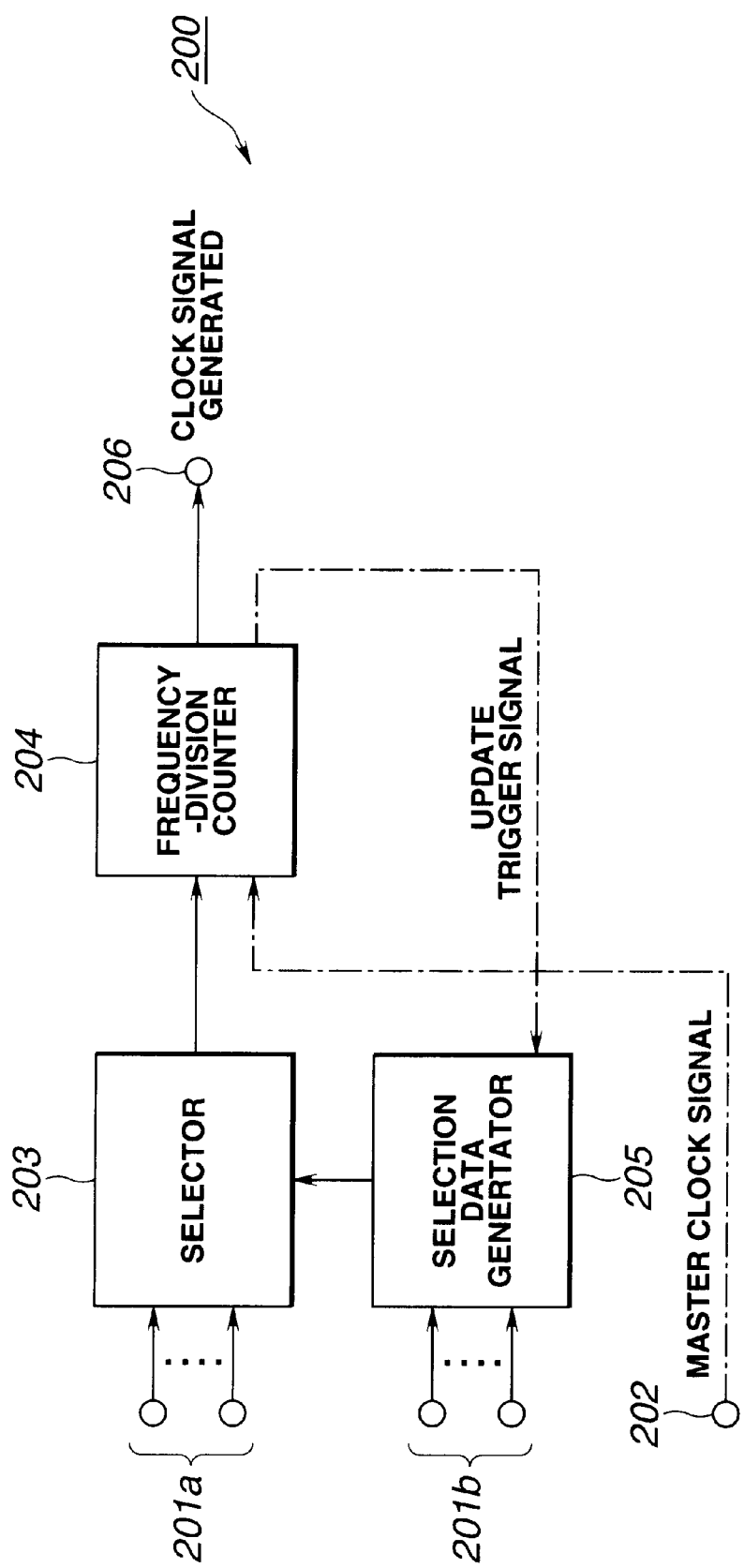
FIG. 6 is a block diagram showing the clock signal generating apparatus according to the invention.

FIG. 6 is a block diagram showing a clock signal generating apparatus 200 that can be used as the clock generating section 127 incorporated in the OFDM receiving system 100 illustrated in FIG. 4.

The clock signal generating apparatus 200 shown in FIG. 6 comprises a selector 203, a frequency-division counter 204, and a selection data generator 205. The selector 203 selects one of the data items that represent various frequency-dividing numbers and that have been input via data input terminals 201a. The frequency-division counter 204 frequency-divides the master clock signal input via a master clock input terminal 202. The selection data generator 205 generates selection data from the data items input through the data input terminals 201b.

To the data input terminals 201a there are supplied the frequency-dividing numbers data items which are represented by the frequency-dividing numbers which are close to the average frequency-dividing numbers S shown in Tables 8A to 8D that are stored in the TPS decoder 126 of the OFDM receiving system 100. To the data input terminals 201b there are supplied the data items from the TPS decoder 126. These data items are signaling parameters that the TPS decoder 126 of the OFDM receiving system 100 has generated by decoding the TPS signal. Among the signaling parameters are a guard interval length GIL, modulation/demodulation mode, a coding ratio (bank chad number).

The selector 203 selects one of the data items input through the data input terminals 201a and representing the frequency-dividing numbers, in accordance with the selection data supplied from the selection data generator 205. The data item thus selected is output to the frequency-division counter 204.

The selection data generator 205 generates the selection data item from the data items input via the data input terminals 201b and corresponding to the transmission mode. The selection data item thus generated is output to the selector 203 so that the frequency-division counter 204 may generate a clock signal that has an average frequency equal to the target clock frequency. In addition, the selection data generator 205 updates the selection data in accordance with an update trigger signal input from the frequency-division counter 204.

Figure 7:
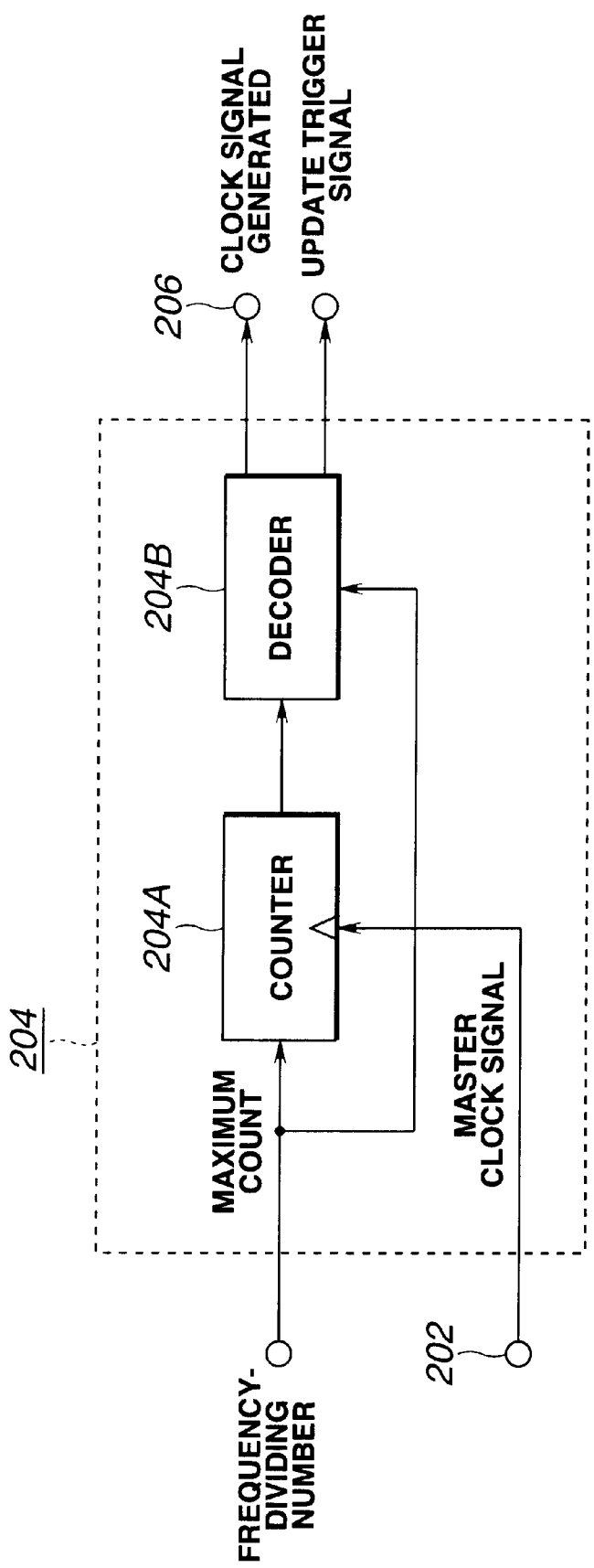
FIG. 7 is a block diagram showing the frequency-division counter used in the clock signal generating apparatus.

On the basis of the data item input from the selector 203 and representing the frequency-dividing number, the frequency-division counter 204 divides the frequency of the master clock signal input via the master clock input terminal 202, thereby generating a clock signal. The clock signal is output through an output terminal 206. As shown in FIG. 7, the frequency-division counter 204 comprises a counter 204A and a decoder 204B. The counter 204A counts the master clock pulses input through the master clock input terminal 202. The decoder 204B decodes the count value generated by the counter 204A.

In the frequency-division counter 204, the maximum count value is set in the counter 204A. The maximum count value is equal to the frequency-dividing number represented by the data item that the selector 203 has selected. Hence, the counter 204A keeps counting the master clock pulses until the count reaches the maximum count value. The decoder 204B decodes the maximum count value, generating an update trigger signal and a clock signal having a duty ratio of 50%.

How the clock signal generating apparatus 200 operates will be explained below.

In the clock signal generating apparatus 200, the data items representing various frequency-dividing numbers and input through the data input terminals 201a are data items that represent the frequency-dividing numbers to be set in the frequency-division counter 204 or the data items that correspond to frequency-dividing numbers. The frequency-dividing numbers are the values determined from the modulation/demodulation mode, coding ratio and guard interval length which are used in the DVB (Digital Video Broadcast)-T.

The selection data generator 205 uses the data items that have been input via the data input terminals 201b and that accord with the transmission mode, thereby selecting one of the selection data items. The selection data item selected is output to the selector 20 so that the frequency-division counter 204 may generate a clock signal that has an average frequency equal to the target clock frequency.

The selector 203 selects one of the data items through the data input terminals 201a and representing the frequency-dividing numbers, in accordance with the selection data input from the selection data generator 205. The data item thus selected is output to the frequency-division counter 204.

The frequency-division counter 204 divides the frequency of the master clock signal input via the master clock input terminal 202, by using the frequency-dividing number input from the selector 203. More specifically, in the frequency-division counter 204, the counter 204A keeps counting the master clock pulses input from the master clock input terminal 202 until its count becomes equal to the frequency-dividing number (i.e., the maximum count value). The decoder 204B generates a clock signal that has the value of while the count of the counter 204A remains 0 to half the maximum count and the value of while the count of the counter 204B remains greater than half the maximum count but not greater than the maximum count.

The frequency-division counter 204 outputs the clock signal, thus generated, through the output terminal 206. Further, the frequency-division counter 204 outputs an update trigger signal to the selection data generator 205. The update trigger signal is output every time the frequency-division counter 204 generates a clock signal.

The selection data generator 205 updates the selected data every time it receives an update trigger signal from the frequency-division counter 204.

The selection data output from the selection data generator 205 and the method of selecting frequency-dividing number data in the selector 203, and the method of effecting frequency division in the frequency-division counter 204 will be described, with reference to actual examples.

To generate a clock signal having a frequency $f_0/n$, from a master clock signal having a frequency $f_0$, the selection data generator 205, in which the selected data is updated by the update trigger signal, repeatedly outputs selection data that serves to select the data representing the frequency-dividing number [n]. The selector 203 selects one of the data items through the data input terminals 201a and representing the frequency-dividing numbers, in accordance with the selection data input from the selection data generator 205. The data item thus selected, which represents the frequency-dividing number [n], is output to the frequency-division counter 204. The frequency-division counter 204 divides the frequency of the master clock signal by the number [n] input from the selector 203, thus generating a clock signal having the frequency $f_0/n$.

A clock signal having a frequency $f_0/2.5$ may be generated from the master clock signal having the frequency $f_0$. In this case, the selection data generator 205, wherein the selected data is updated by the update trigger signal, alternately outputs two selection data items. The first data item designates the selection of the data that represents a frequency-dividing number [2]. The second data item designates the selection of the data that represents a frequency-dividing number [3]. In accordance with the two selection data items, the selector 203 alternately selects two data items that represent the frequency-dividing numbers [2] and [3], respectively, from those input through the data input terminals 201a. The two data items, thus selected, are output to the frequency-division counter 204. In accordance with the two data items, thus selected, the frequency-division counter 204 divides the frequency of the master clock signal, alternately by the frequency-dividing numbers [2] and [3], thus generating a clock signal having the frequency $f_0/2.5$.

Alternatively, a clock signal having a frequency $f_0/(66/8)$ may be generated from the master clock signal having the frequency $f_0$. In this case, the selection data generator 205, wherein the selected data is updated by the update trigger signal, outputs a first selection data item seven times and a second selection data item once. The first data item designates the selection of the data that represents a frequency-dividing number [8]. The second data item designates the selection of the data that represents a frequency-dividing number [10]. In accordance with these two selection data items, the selector 203 selects a data item representing the numbers [8] eight times, and a data item representing the number [10] one time, from those input through the data input terminals 201a. The two data items, thus selected, are output to the frequency-division counter 204. In accordance with the two data items, thus selected, the frequency-division counter 204 divides the frequency of the master clock signal by the number [8] seven times, and by the number [10] once. As a result, the frequency-division counter 204 generates a clock signal having an average frequency of $f_0/(66/8)$.

When two different frequency-dividing numbers are used in this way, it is possible to generate a clock signal that has an average frequency close to the frequency of a desired clock signal.

The clock signal having the frequency of $f_0/2.5$, however, has its leading edge delayed at every other pulse. In the case where the frequency-dividing number is an odd number, it is impossible to impart a duty ratio of 50% to the clock signal generated.

Three or more frequency-dividing numbers may be used to generate a clock signal.

Namely, the clock signal generating apparatus 200 generates a clock signal by using one, two, three or more frequency-dividing numbers.

The relation among the values of the data items input to the clock signal generating apparatus 200 will be explained. The frequency $f_{OUT}$ of the output clock signal that is required in the DVB-T is given by the following equation (11):

$$f_{OUT}=1728\times((QAM\times rate)/(2048+GIL)) \text{ [MHz]} \tag{11}$$

where QAM (Quadrature Amplitude Modulation), rate, and GIL are respectively the modulation mode, the coding ratio and the guard interval length, all applied in the DVB-T.

The equation (11) is transformed to the following equation (12), by using a master clock signal having a frequency $f_0$.

$$f_{OUT}=f_0 \times K \times (QAM \times rate)/(2048+GIL) \tag{12}$$

From the equation (12), the frequency-dividing number [N] desired for the master clock signal is given as follows:

$$N=(2048+GIL)/((QAM\times rate)\times K) \tag{13}$$

Assume that $f_0=(64/7)\times 6$ MHz (K=63/2), QAM=2, rate=½, and GIL=512. Then, the desired frequency-dividing number [N] is calculated by the following equation (14):

$$N = (2048+512)/(2\times(1/2)\times(63/2)) \qquad (14)$$

$$= 5120/63$$

$$= 81.26$$

In the clock signal generating apparatus 200 shown in FIG. 6, the frequency-division counter 204 processes only even frequency-dividing numbers. Hence, the apparatus 200 can generate a clock signal having a duty ratio of 50%. That is, the clock signal "1" while the count of the counter 204A remains 0 to half the maximum count and is "0" while the count of the counter 204B remains greater than half the maximum count but not greater than the maximum count.

For example, if the data input from the selector 203 designates the frequency-dividing number [81.26 . . . defined by the equation (14), the frequency-division counter 204 will round off the frequency-dividing number [81.26 . . . ] at the even-number unit and will carry out frequency division by using frequency-dividing numbers [80] and [82].

If the frequency-division counter 204 processes frequency-dividing numbers other than even frequency-dividing numbers, the frequency-division counter 204 can use frequency-dividing numbers [81] and [82]. In this case, however, a duty ratio of 50% cannot be imparted to the clock signal generated, as has been indicated above.

In the clock signal generating apparatus 200 shown in FIG. 6, only two data items A and B may be input to the selector 203 through the data input terminals 201a, and the master clock signal may be frequency-divided by the frequency-dividing numbers represented by these data items A and B.

If it is desirable to divide the frequency of the master clock signal by the desired frequency-dividing number of 5120/68=81.26 . . . the data item A will represent the frequency-dividing number [80] and the data item B will represent the frequency-dividing number [82]. In this case, only odd frequency-dividing numbers can be used.

That is, the data item A represents that one of the frequency-dividing numbers the frequency-division counter 204 can use, which is smaller than the desired frequency-dividing number and which is the most close thereto. On the other hand, the data item B represents that one of the frequency-dividing numbers the frequency-division counter 204 can use, which is greater than the desired frequency-dividing number and which is the most close thereto.

Thus, a clock signal can be generated with high precision by using two data items A and B, namely, two frequency-dividing numbers which are smaller and greater than the desired frequency-dividing number, respectively, and which are closer to the desired frequency-dividing number than any other frequency-dividing numbers that can be used in the frequency-division counter 204.

Further, of the two data items A and B (representing the frequency-dividing numbers [A] and [B], respectively), the one that has a smaller leading-edge error may be selected. Then, it is possible to generate a clock signal having a leading-edge error smaller than in the case where the frequency of the master clock signal is divided by the use of three or more frequency-dividing numbers.

The reason why will be explained. Assume the two frequency-dividing numbers that can be used are both even numbers. Then, the frequency-dividing numbers [A] and [B] have the relation of the following equation (15):

$$B=A+2 \qquad (15)$$

At the time the master clock signal is completely frequency divided for the first time, the average frequency-dividing number [S] and the frequency-dividing numbers [A] and [B] hold the relation of the following formula (16):

$$A<S<B \qquad (16)$$

Applying the equation (15) to the equation (16), we will have the following formula (17):

$$A<S<A+2 \qquad (17)$$

Therefore, if the first leading-edge error is 0 clock, the leading-edge error $\epsilon$ at the time the master clock signal is completely frequency divided for the first time will be the difference between the average frequency-dividing number [S] and the frequency-dividing number [A] or [B] that is closer to the desired frequency-dividing number. Due to the relation represented by the equation (17) that holds, the leading-edge error $\epsilon$ is considered to fall within the range indicated by the following formula (18):

$$-1 \leq \epsilon < +1 \qquad (18)$$

The leading-edge error $\epsilon$ may have a positive value. In other words, the frequency-divided clock signal may rise at a time later than the time it should rise. If this is the case, the following formula (19) or (20) will holds for times Ri, RA and RB:

$$Ri \leq RA < RB \qquad (19)$$

$$RA \leq Ri < RB \qquad (20)$$

where Ri is the time the frequency-divided clock signal should rise (i.e., the time the master clock signal is completely frequency divided for the second time), RA is the time the clock signal obtained by dividing the master clock signal by using the frequency-dividing number [A] rises, and RB is the time the clock signal obtained by dividing the master clock signal by using the frequency-dividing number [B] rises.

In the formulae (19) and (20), the equal symbol indicates the condition for completing the cycle.

In the case of the formula (19), A<S. The leading-edge error $\epsilon$ is smaller than the previous time. That is, it is guaranteed that the leading-edge error $\epsilon$ is less than +1 clock.

In the case of the formula (20), the time Ri the frequency-divided clock signal should rise follows the time RA when the clock signal rises and precedes the time RB when the other clock signal rises. Hence, a leading-edge error $\epsilon$ falling within the range of ±1 clock can be guaranteed, only if the frequency-dividing numbers [A] and [B] applied are close to the average frequency-dividing number [S].

The leading-edge error $\epsilon$ may have a negative value. That is, the frequency-divided clock signal may rise at a time earlier than the time it should rise. If this is the case, the following formula (21) or (22) will holds for the times Ri, RA and RB:

$$Ri \leq RA < RB \qquad (21)$$

$$RA \leq Ri < RB \qquad (22)$$

In the case of the formula (21), S<B. The leading-edge error $\epsilon$ is smaller (in absolute value) than the previous time. That is, it is guaranteed that the leading-edge error $\epsilon$ is less than −1 clock.

In the case of the formula (22), the time Ri the frequency-divided clock signal should rise follows the time RA when the clock signal rises and precedes the time RB when the other clock signal rises. Therefore, a leading-edge error $\epsilon$ falling within the range of ±1 clock can be guaranteed.

The same can be said of the times when the master clock signal is completely frequency divided for the third time, the fourth time, and so on. It can therefore be guaranteed that the leading-edge error ε always fall within the range of ±1 clock.

If two frequency-dividing numbers [A] and [B], which are other than those which are most close to the average frequency-dividing number S, are used to effect frequency division, the resultant leading-edge error will fall outside the range of ±1 clock. If three or more frequency-dividing numbers are used at a certain time to achieve frequency division, the leading-edge error will increase, falling outside the range of ±1 clock.

Hence, if one of two frequency-dividing numbers that are most close to the average frequency-dividing number S, which results in a smaller leading-edge than the other, is selected and applied, the leading-edge error will be smaller than in the case where three or more frequency-dividing numbers are used to achieve frequency division.

Figure 8:
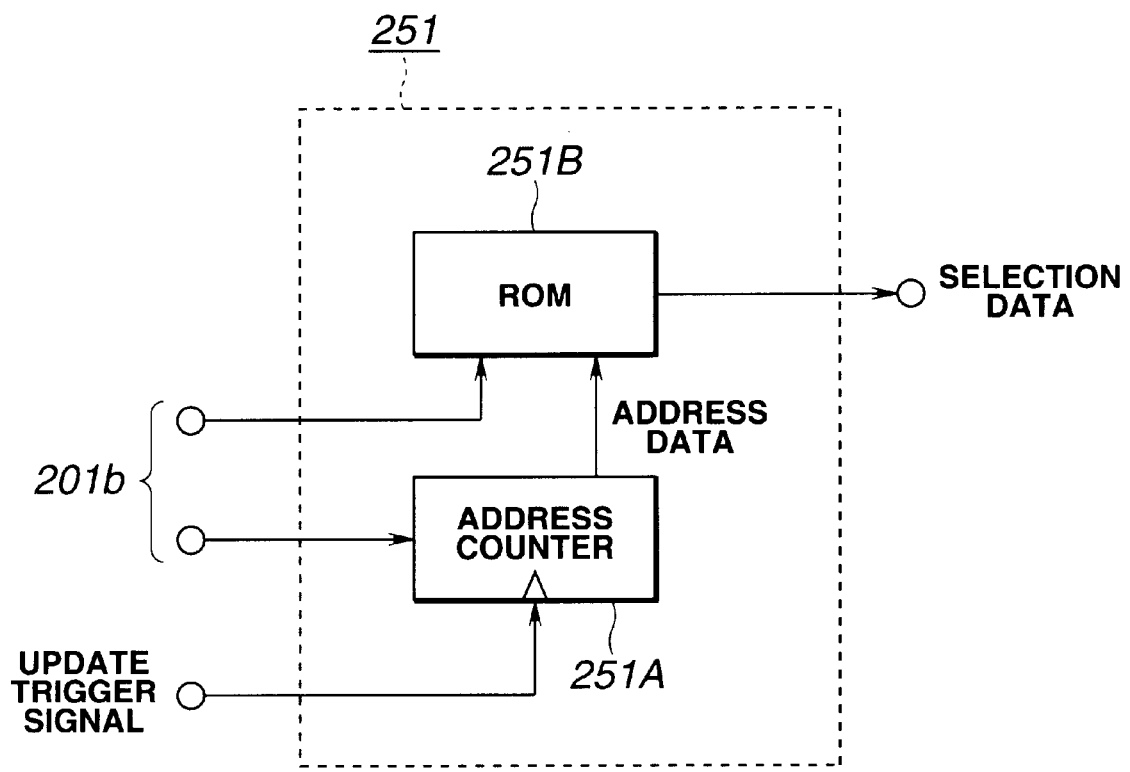
FIG. 8 is a block diagram depicting the selection data generator provided in the clock signal generating apparatus.

The selection data generator 205 provided in the clock signal generating apparatus 200 may be, for example, a ROM table that stores the selection data representing the relation between the frequency-dividing number data items input via the data input terminals 201a, on the one hand, and the data items input via the data input terminals 201b, on the other hand. More precisely, a selection data generator 251 shown in FIG. 8 may be used as the selection data generator 205. As FIG. 8 shows, the selection data generator 251 comprises an address counter 251A and a ROM 151B. The address counter 251A counts update trigger signals input from the frequency-division counter 204, generating address data. Selection data is read from the ROM 151B when designated by the address data supplied from the address counter 151A.

The selection data generator 251 has input data terminals 201b. The input data terminals 201b receive signaling parameters (i.e., data items) from the TPS decoder 126 of the OFDM receiver 120. Among the signaling parameters are the modulation mode, coding ratio and guard interval length.

Set in the address counter 251A is the maximum count that is equal to the number of times a frequency-dividing number is used. This frequency-dividing number corresponds to the transmission mode determined from the data items input via the input data terminals 201b, i.e., the modulation mode, coding ratio and guard interval length that are applied in the DVB-T. The address counter 251A keeps counting the update trigger signals input from the frequency-division counter 204 until the count reaches the maximum count, generating address data.

The ROM 251B stores various selection data tables of transmission modes for the frequency-dividing numbers, each determined from the modulation mode, coding ratio and guard interval length that are applied in the DVB-T. One of the selection data tables is selected in accordance with the data items supplied via the data input terminals 201b. A selection data item is read from the selection data table thus selected, in accordance with the address data.

How the selection data generator 251 does operate will be explained, with reference to the specific numerical data involved. The data which designate a frequency-dividing number [5120/63 (=81.26 . . . )] may be input to the data input terminals 201b. If so, the selection data generator 251 will output selection data instructing that the frequency-dividing number [80], i.e., data A, be selected 23 times and that the frequency-dividing number [82], i.e., data B, be selected 40 times. Therefore, 5120 (=80×23+82×40) master clock pulses are used, thus generating 63 (=23+40) clock pulses. The average frequency of the clock signal thus generated is therefore equal to the desired frequency.

In the clock signal generating apparatus 200, the selection data generator 205 may generate selection data satisfying the requirement that the target clock signal and the clock signal generated may have the least phase error at the leading edges.

The method of generating the selection data that satisfies that requirement will be described below. First, let us consider the time when the signal will rise next. The time may be the time when the target clock signal will rise or may be the time when the clock signal generated by applying the frequency-dividing number input to the selector 203. The selection data generator 205 is controlled so that the selector 203 may select the frequency-dividing number that will be used to generate a clock signal rising at the time most close to the time the target clock signal rises. This control is repeated, whereby selection data satisfying the above-mentioned requirement is generated. This selection data can be obtained from two data items which have been input via the data input terminals 201a and which represent two frequency-dividing numbers, respectively. The selection data can be supplied to the selection data generator 205 beforehand.

To divide the frequency of the master clock signal by, for example, the frequency-dividing number 5120/63, the master clock signal is frequency-divided 23 times by the frequency-dividing number 80 and then 40 times by the frequency-dividing number 82. If this method is used, the phase error accumulated becomes maximal when the master signal is frequency-divided for the twenty-third time by the frequency-dividing number 80. In another method, the frequency of the master clock signal may be divided by 80 once it has been divided by 82 twice. Then, the phase error accumulated is smaller than in the first-mentioned method. Hence, the second-mentioned method is employed.

The selection data generator 205 generates selection data based on the condition of minimizing the phase error between the leading edges of the target clock signal and the clock signal generated. The generator 205 may be, for example, a selection data generator 252 having the structure shown in FIG. 9.

Figure 9:
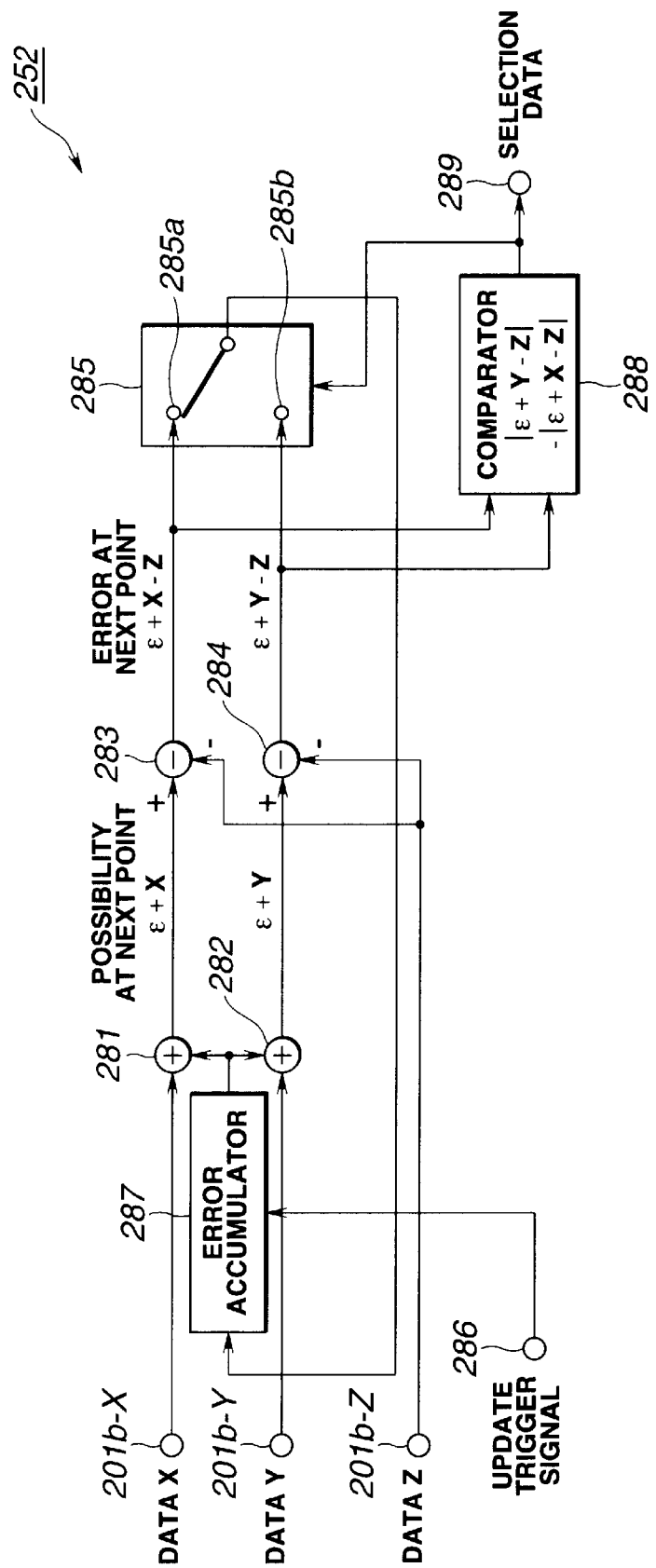
FIG. 9 is a block diagram illustrating the actual structure of the selection data generator incorporated in the clock signal generating apparatus.

In the selection data generator 252 shown in FIG. 9, input data is supplied from an input terminal 201b-X to an adder 281. Another input data is supplied from an input terminal 201b-Y to an adder 282. Still other input data is supplied from an input terminal 201b-Z to subtracters 283 and 284. An update trigger signal is supplied from an update trigger signal input terminal 286 to an error accumulator 287.

The error accumulator 287 holds the phase error ε between the leading edges of the target clock signal and the clock signal generated. The phase error ε is supplied from the accumulator 287 to the adders 281 and 282.

The adder 281 adds data X to the phase error ε. The adder 282 adds data Y to the phase error ε. The subtracters 283 and 284 take data Z from the data input to them.

A comparator 288 compares the data items input from the subtracters 283 and 284 to determine which date item is greater than the other is. A selector 285 has a movable contact and two terminals 285a and 285b. The movable contact is connected to either the terminal 285a or 285b in accordance with the data input from the comparator 288. Thus, the selector 285 selects one of the two data items input to it. The data item selected is output to the error accumulator 287.

Figure 10:
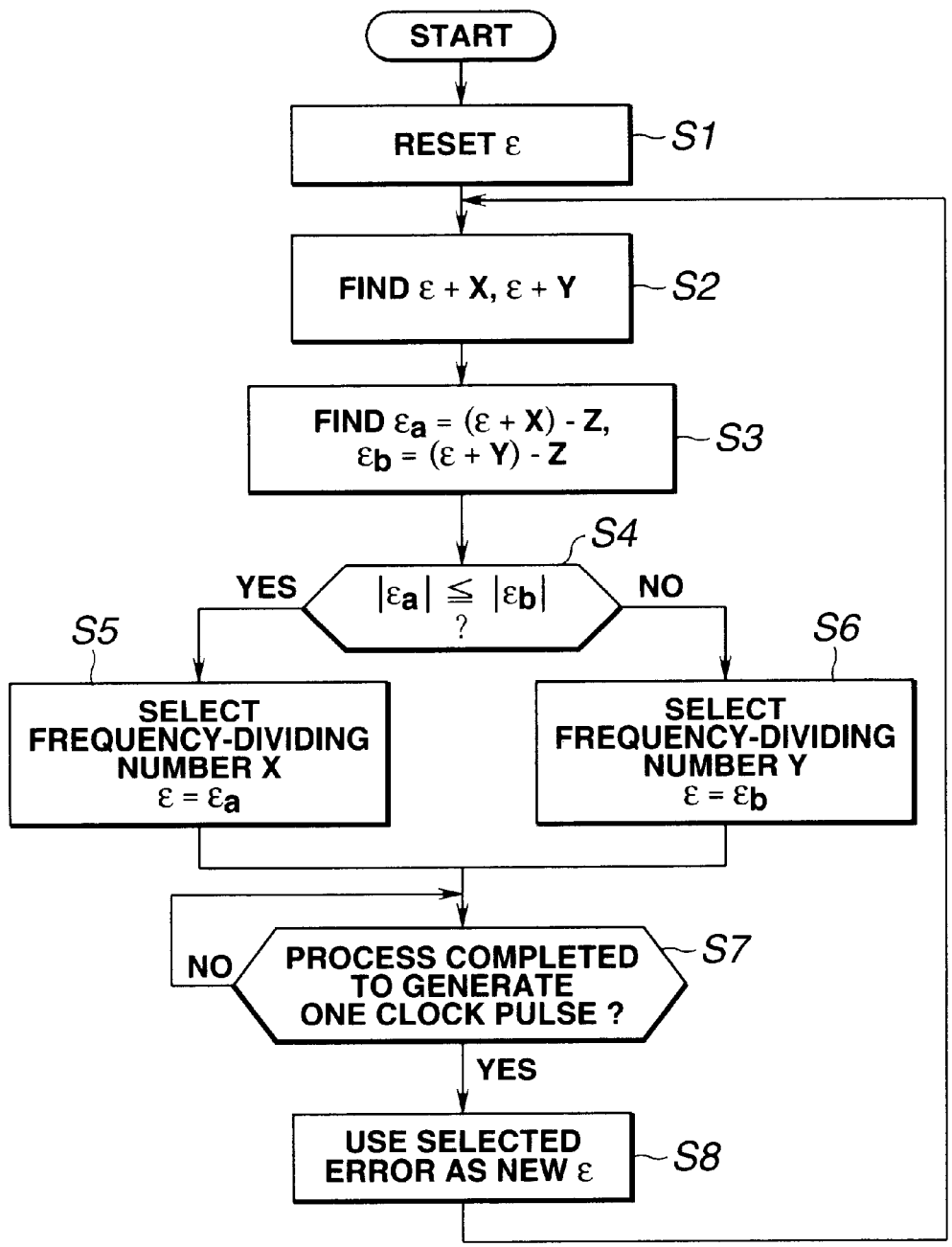
FIG. 10 is a flow chart for explaining the operation of the selection data generator.

How the selection data generator 252 does operate will be explained, with reference to the flow chart of FIG. 10.

Let us assume that the data designating the frequency-dividing number [80] (hereinafter such data will be referred to as data X(80) is input to the input terminal 201b-X. Also assume the data Z(82) designating the frequency-dividing number [82] is input to the input terminal 201b-Y and that data Z(81.26) is input to the input terminal 201b-Z. The data Z(81.26) represents the value corresponding to the frequency-dividing number that will be used to generate the target clock signal.

In Step S1, the error accumulator 287 resets the phase error $\epsilon$ to 0. The phase error $\epsilon$ is output to the adders 281 and 282.

In Step S2, the adder 281 adds the phase error $\epsilon$ and the input data X, generating the sum $\epsilon+X$, and the adder 282 adds the phase error $\epsilon$ and the input data Y, generating the sum $\epsilon+Y$. The sums, thus generated, represent the phase of the clock signal that will be generated. In this instance, $\epsilon=0$, X=80, Y=82

Hence, $\epsilon+X=80$, $\epsilon+Y=82$

In Step S3, the subtracter 283 subtracts the data Z from the data $\epsilon+X$ input from the adder 281, thus obtaining the following:

$\epsilon+X-Z=a$

Similarly, the subtracter 284 subtracts the data Z from the data $\epsilon+Y$ input from the adder 282, thus obtaining the following:

$\epsilon+Y-Z=b$

The values thus obtained indicate the phase errors that the clock signal to be generated may have. In this instance,

Z=81.26

Therefore, $$\varepsilon a = 80 - 81.26 = -1.25$$

$$\varepsilon b = 82 - 81.26 = 0.74$$

The data items $\epsilon a$ and $\epsilon b$, thus generated, are output to the comparator 288. They are output to the selector 285, also.

In Step S4, the comparator 288 compares the absolute value $|\epsilon a|$ of the input data item $|\epsilon a|$ with the absolute value $|\epsilon b|$ of the input data item $|\epsilon b|$. The data item having a smaller absolute value than the other is selected. The absolute value of the phase error selected is used as the reference for determining the leading-edge error. If $|\epsilon a|<|\epsilon b|$, the flow goes to Step S5. If $|\epsilon a|>|\epsilon b|$, the flow goes to Step S6. If $|\epsilon a|=|\epsilon b|$, the flow may go to Step S5 or Step S6. In the present embodiment, the flow goes to Step S5 if $|\epsilon a|=|\epsilon b|$.

In the case where $|\epsilon a|\leq|\epsilon b|$, the comparator 288 selects $|\epsilon a|$ in Step S5, and the selection data that designates the data X=80, i.e., a frequency-dividing number, is output to the selector 231. If $|\epsilon a|>|\epsilon b|$, the data $|\epsilon a|$ is selected in Step S6, and the selection data that designates the data Y=82, i.e., a frequency-dividing number, is output to the selector 231.

Here, $|\epsilon a|=|-1.26|=1.26$ $|\epsilon b|=|0.74|=0.74$

Thus, $|\epsilon a|>|\epsilon b|$

Therefore, the flow goes to Step S6, in which the data $\epsilon b$ is selected and the data Y=82 is selected as the frequency-dividing number.

The comparator 288 outputs the data selected (in this instance, data $\epsilon b$) to the selector 285. In the selector 285 the movable contact is connected to the terminal 285a if $|\epsilon a|\leq|\epsilon b|$, and to the terminal 258b if $|\epsilon a|>|\epsilon b|$. Since $|\epsilon a|>|\epsilon b|$ in this case, the movable contact of the selector 285 is connected to the terminal 285b.

In Step S7, it is determined whether one clock pulse has been generated for the output clock signal (that is, whether an update trigger signal has been received from the frequency-division counter 204). If it is determined in Step S7 that the process for one clock pulse has not been completed, Step S7 is repeated. If it is determined in Step S7 that the process for one clock pulse has been completed, the flow goes to Step S8.

In Step S8, new process is performed in which the error selected in Step S5 or Step S6 ($\epsilon b$, in this case) is applied as new error $\epsilon$. That is, the leading-edge error $\epsilon$ selected by the selector 285 ($\epsilon b$, in this case) is stored into the error accumulator 287 at the time the update trigger signal is output from the update trigger signal input terminal 286. The flow returns to Step S2, whereby the steps described above are repeated.

Thus, the phase error $\epsilon$ is accumulated in the error accumulator 287 every time one output clock pulse is generated. As the above-mentioned steps are repeated, the selection data generator 252 shown in FIG. 9 can generate selection data that minimizes the phase error between the leading edges of the target clock signal and the clock signal generated.

Figure 11:
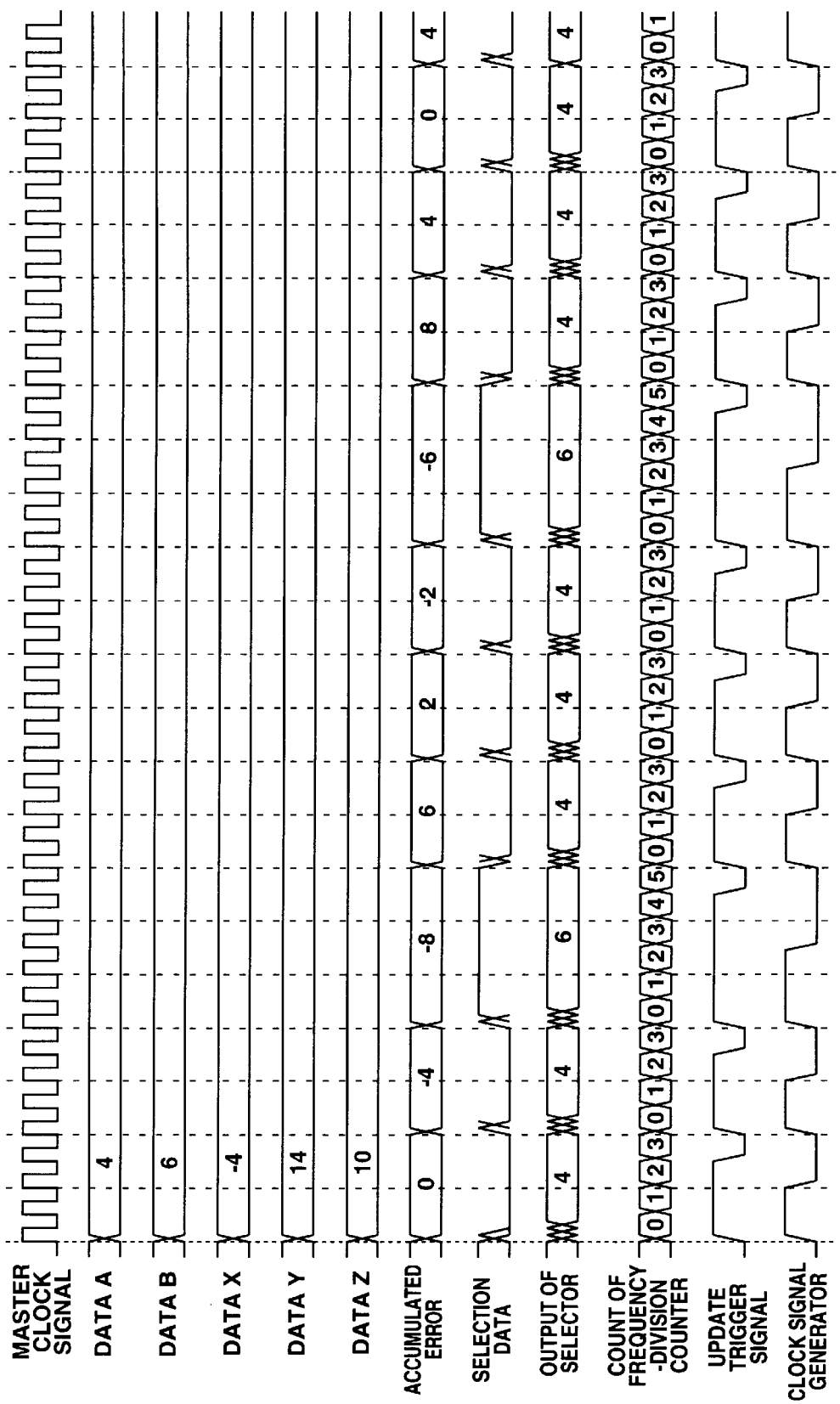
FIG. 11 is a timing chart for explaining the operation of the clock signal generating apparatus.

The process of selecting the frequency-dividing number [4] seven times and the frequency-dividing number [6] two times may be repeated, thereby generating a clock signal of frequency $f_0/(40/9)$ from the master clock signal having the frequency $f_0$. How such a clock signal is generated is illustrated in the timing chart of FIG. 11.

In the embodiment described above, the data Z and the leading-edge error $\epsilon$ are numbers, each having a decimal fraction. If a digital circuit is to generate data representing either number, it must be complicated in structure. Thus, the digital circuit can be more simple if the data Z and the error $\epsilon$ are integral numbers. This will be explained as follows, by applying specific numerical values. Data X=80, data Y=82, and data Z=81.26 (=5120/63). All these values are multiplied by 63, whereby data X=5040, data Y=5166, and data Z=5120. That is, the values and the leading-edge error $\epsilon$, all computed in the circuit, become integral numbers. The structure of the circuit is thereby rendered simple. In the transmission mode applied in the DVB-T, too, the denominator n of data Z may be used, and all related data items may be multiplied by n. Then, the circuit becomes simpler in structure.

Figure 12:
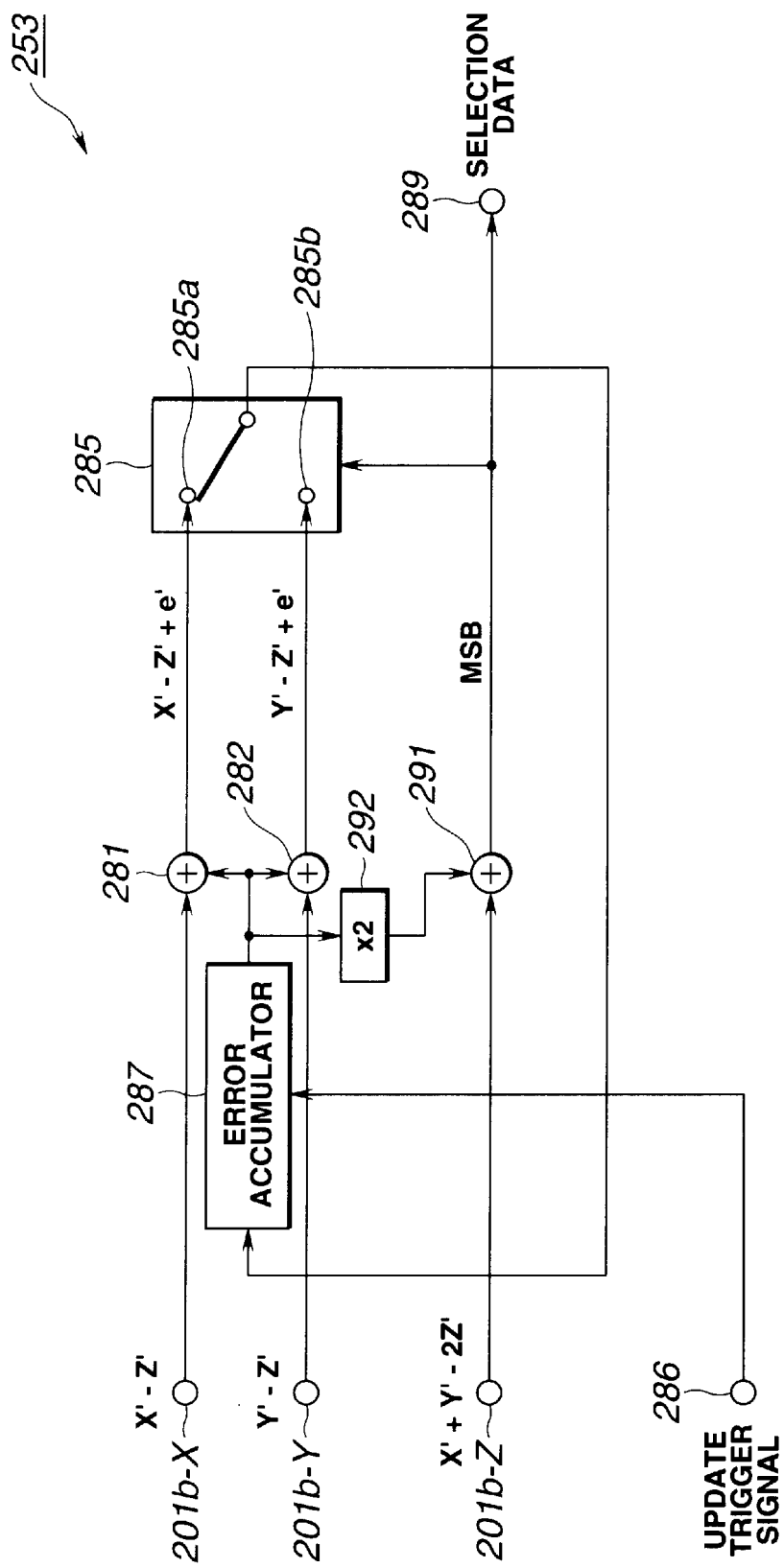
FIG. 12 is a block diagram of a selection data generator that is more simple in structure than the above-mentioned one.

FIG. 12 is a block diagram of a selection data generator 253 that is simpler in structure than the above-mentioned one 252 illustrated in FIG. 9. In the selection data generator 253 shown in FIG. 12, fixed values are input via the input terminals 201b-X and 201b-Y, thereby reducing the number of adders required. All data items processed in the selection data generator 253 are integral numbers. The data items X', Y', Z' and ' are all integral numbers, as distinguished by symbol '.

Data X'-Z' already calculated, is input via the input terminal 201b-X. Data Y'-Z' already computed, is input via the input terminal 201b-Y. Data X'+Y'-2×Z', already computed, is input via the input terminal 201b-Z.

The adders 281 and 282 are designed to add the error $\epsilon'$ to the data input to them. A×2 multiplier 292 multiplies the error ' by 2 and outputs the product, 2×', to an adder 291. The adder 291 adds error 2×' and data X'+Y'-2×Z', both input to it.

The selector 285 is the same as the selector 285 incorporated in the selection data generator 252 illustrated in FIG. 9.

The selection data generator 253 shown in FIG. 12 will be now described. Data X'-Z' input via the input terminal 201b-X is input to the adder 281. Data Y'−Z' input via the input terminal 201b-Y is input to the adder 282. Data X'+Y'−2×Z' input via the input terminal 201b-Z is input to the adder 291. The update trigger signal input via the input terminal 286 is input to error accumulator 287.

The error ε' stored in the error accumulator 287 is output to the adder 281, the adder 282 and the ×2 multiplier 292.

The adder 281 adds the error ε' stored in the error accumulator 287 and the data X'−Z', obtaining the sun X'−Z'+'. The sum is output to the selector 285. The adder 282 adds the error ' stored in the error accumulator 287 and the data Y'−Z', obtaining the sum Y'−Z'+'. This sum is output to the selector 285.

The ×2 multiplier 292 multiplies the error ε' generating a product 2x'. The product 2x' is output to the adder 291. The adder 291 adds the error 2x' and the data X'−Y'−2×Z', obtaining the value of 2x'+X'+Y'−2×Z'. This value is identical to |a|−|b|, i.e., the integral value obtained in Step S4 shown in FIG. 10. The adder 291 generates a signal representing the data, 2x'+X'+Y'−2×Z'. This signal is output through the selection data signal output terminal 289 and supplied to the selector 285.

In the selector 285, the movable contact is connected to the terminal 285b if the data input from the adder 291 has a positive value, and to the terminal 258a if the data has a negative value. If the movable contact is connected to the terminal 258a, the selector 285 outputs the data X'−Z'+'. If the movable contact is connected to the terminal 258b, the selector 285 outputs the data Y'−Z'+'.

Thereafter, the data output from the selector 285 is supplied to the error accumulator 287 in the same way as in the selection data generator 252 illustrated in FIG. 9. The error accumulator 287 stores the leading-edge error input. The selection data generator 253 shown in FIG. 12 repeats the process described above.

As indicated above, fixed values are input to the selection data generator 253 shown in FIG. 12. The number of adders required can therefore be reduced. This serves to simplify the circuit structure and shorten the calculation time.

In the process described above, the selection data is generated based on the leading-edge error of the clock signal. Instead, the selection data may be generated based on the trailing-edge error of the clock signal.

Figure 13:
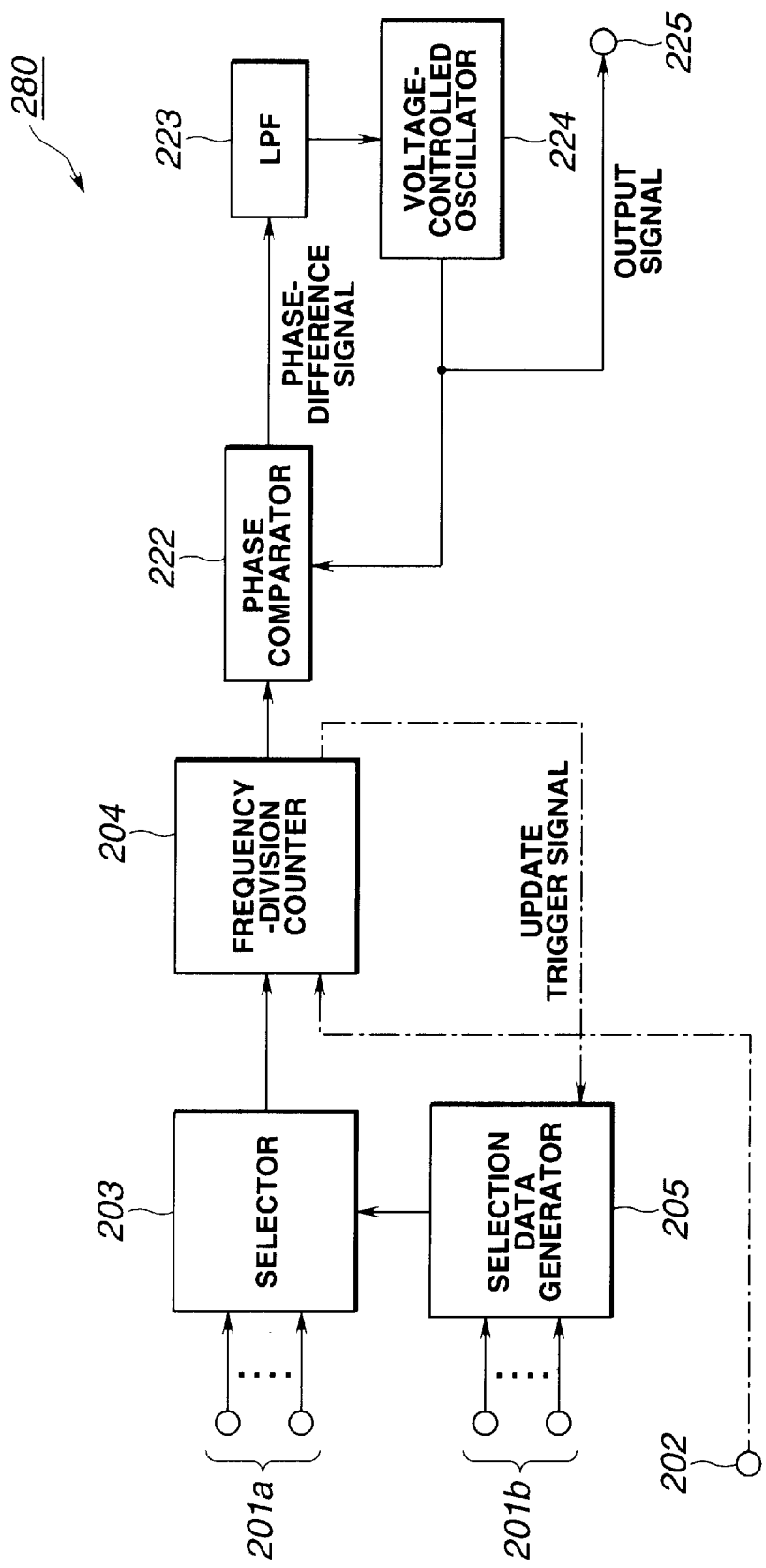
FIG. 13 is a block diagram of another clock signal generating apparatus according to the present invention.

FIG. 13 is a block diagram of a clock signal generating apparatus according to another embodiment of the present invention. The clock signal generating apparatus 280 shown in FIG. 13 is a combination of the clock signal generating apparatus 200 shown in FIG. 6 and a clock signal generating apparatus having a PLL. The clock signal output from the frequency-division counter 204 provided in the clock signal generating apparatus 200 shown in FIG. 6 is supplied to a phase comparator 222. The clock signal is output from an output terminal 225 after passing through an LPF 223 and a voltage-controlled oscillator 224.

The clock signal generating apparatus 280 comprises a selector 203, a frequency-division counter 204, and a selection data generator 205. The selector 203 selects one of the data items which have been input via data input terminals 201a and which represent frequency-dividing numbers. The frequency-division counter 204 divides the frequency of the master clock signal input via a master clock input terminal 202. The selection data generator 205 generates selection data from the data items input through data input terminals 201b. The selector 203, counter 204 and generator 205 process data components of large frequency-division ratios. The phase comparator 222, LPF 223 and voltage-controlled oscillator 224 constitute a PLL, which processes the data components of small frequency-division ratios (i.e., error components).

In the clock signal generating apparatus 280 illustrated in FIG. 13, the PLL processes the data components having small frequency-division ratios (i.e., error components), after the data components of large frequency-division ratios have been processed. This helps enhance the operating stability of the feedback loop.

As has been described, both clock signal generating apparatuses 200 and 280 according to this invention are simple in terms of circuit structure and can therefore be easily provided in the form of an LSI.

The clock signal generating apparatus 200 or 280 may be used as the clock generating section 127 of the OFDM receiving system 100 illustrated in FIG. 4. If so, the clock generating section 127 can generates about 50 clock signals of different frequencies, which are necessary in the OFDM receiving system 100.

In the OFDM receiving system 100 of FIG. 4, the clock generating section 127 supplies a clock signal to the rate converting section 125 that is connected to the output of the FEC circuit 124. Alternatively, the rate converting section 125 may be connected to the input of the FEC circuit 124.

Moreover, the clock signal generating apparatuses 200 and 280 according to the present invention can be applied not only to OFDM receiving systems, but also to other technical fields.

What is claimed is:

1. A clock signal generating apparatus comprising:
   selection means for selecting one of two frequency-dividing number data items in accordance with selection data, one of data items representing at least one integral frequency-dividing number greater than a ratio (fa/fb) of a frequency (fa) of an input clock signal to a frequency (fb) of a target output clock signal, and an other of the data items representing at least one integral frequency-dividing number smaller than the ratio (fa/fb);
   frequency-dividing means for dividing a frequency of the input clock signal by the frequency-dividing number represented by the data item selected by the selection means, thereby generating an output clock signal; and
   selection data generating means for generating the selection data in accordance with frequency data representing a target frequency (fb), the selection data causing the selection means to select the frequency-dividing number data item repeatedly in response to clock pulses of the input clock signal, thereby dividing the frequency of the input clock signal and to make an average frequency of the clock signal output from the frequency-dividing means equal to the frequency (fb).

2. The clock generating apparatus according to claim 1, wherein the selection means selects only an even number as a frequency-dividing number.

3. The clock generating apparatus according to claim 1, wherein the selection means selects the data item representing one integral frequency-dividing number greater than the ratio (fa/fb) or the data item representing one integral frequency-dividing number smaller than the ratio (fa/fb), in accordance with the selection data supplied from the selection data generating means.

4. The clock generating apparatus according to claim 3, wherein the selection means selects only two data items representing two frequency-dividing numbers that are closer to the ratio (fa/fb) than any others in accordance with the selection data supplied from the selection data generating means.

5. The clock generating apparatus according to claim 1, wherein the selection data generating means comprises a storage section storing the selection data in a form of a table and an address data generating section for generating address data for reading the selection data from the storage section.

6. The clock generating apparatus according to claim 1, wherein the selection data generating means supplies the selection means with selection data to minimize an edge error of the output clock signal generated with respect to the target output clock signal.

7. The clock generating apparatus according to claim 1, wherein the selection data generating means supplies the selection data to the selection means every time the frequency-dividing means produces an output clock pulse.

8. The clock generating apparatus according to claim 1, wherein the selection data means generates the selection data by performing a predetermined calculation.

9. A method of generating a clock signal, comprising the steps of:

generating a frequency-dividing number data item representing at least one integral frequency-dividing number greater than a ratio (fa/fb) of a frequency (fa) of an input clock signal to a frequency (fb) of a target clock signal, and the frequency-dividing number data item representing at least one integral frequency-dividing number smaller than the ratio (fa/fb);

dividing the frequency of the input clock signal by repeatedly using at least two frequency-dividing numbers represented by the frequency-dividing number data items, in accordance with selection data; and generating an output clock signal having a frequency equal to the frequency (fb) of the target clock signal.

10. The method of generating the clock signal, according to claim 9, wherein the frequency of the input clock signal is divided by using only an even number as the frequency-dividing number.

11. The method of generating a clock signal, according to claim 9, wherein one frequency-dividing number data item representing an even frequency-dividing number greater than the ratio (fa/fb) and one frequency-dividing number data item representing an even frequency-dividing number smaller than the ratio (fa/fb) are selected in accordance with the selection data.

12. The method of generating a clock signal, according to claim 9, wherein only two data items representing two frequency-dividing numbers that are closer to the ratio (fa/fb) than any others are selected in accordance with the selection data.

13. The method of generating the clock signal, according to claim 9, wherein the frequency-dividing number data item is selected in accordance with selection data to minimize an edge error of the output clock signal generated with respect to the target output clock signal.

14. A signal-receiving apparatus comprising:

demodulation means for demodulating a recieved orthogonal frequency-division multiplex signal;

clock signal generating means for generating two frequency-dividing number data items in accordance with transmission parameter data contained in a demodulated signal output from the demodulation means and repeatedly using at least two frequency-dividing numbers represented by the frequency-dividing number data items, in accordance with selection data, thereby dividing a frequency of an input clock signal and generating an output clock signal having an average frequency equal to a target frequency (fb) that accords with a transmission mode, one of the frequency-dividing number data items representing at least one integral frequency-dividing number greater than a ratio (fa/fb) of a frequency (fa) of the input clock signal to a frequency (fb) of a target output clock signal, and an other of the frequency-dividing number data items representing at least one integral frequency-dividing number smaller than the ratio (fa/fb); and rate converting means for converting a clock rate of the demodulated signal output from the clock signal generating means, to a data rate that accords with the transmission mode, by using the output clock signal generated by the clock signal generating means.

15. The signal-receiving apparatus according to claim 14, wherein the clock signal generating means comprises:

selection means for selecting two frequency-dividing number data items, one of the data items representing at least one integral frequency-dividing number greater than the ratio (fa/fb) of the frequency (fa) of an input clock signal to the frequency (fb) of the target output clock signal, and the other of the data items representing at least one integral frequency-dividing number smaller than the ratio (fa/fb);

frequency-dividing means for dividing the frequency of the input clock signal by the frequency-dividing number represented by the data item selected by the selection means; and selection data generating means for generating the selection data in accordance with frequency data representing the target frequency (fb), the selection data causing the selection means to select the frequency-dividing number data item repeatedly, thereby to divide the frequency of the input clock signal and to generate the selection data for making the average frequency of the output clock signal generated by the frequency-dividing means equal to the target frequency (fb), in accordance with a transmission mode represented by transmission parameters.

* * * * *